(12) United States Patent
Yuzurihara et al.

(10) Patent No.: US 9,451,687 B2
(45) Date of Patent: Sep. 20, 2016

(54) HIGH-FREQUENCY POWER SUPPLY DEVICE, AND PLASMA IGNITION METHOD

(71) Applicant: KYOSAN ELECTRIC MFG. CO., LTD., Yokohama-shi, Kanagawa (JP)

(72) Inventors: Itsuo Yuzurihara, Yokohama (JP); Satoshi Aikawa, Yokohama (JP); Ryosuke Ohma, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 14/904,886

(22) PCT Filed: Mar. 12, 2014

(86) PCT No.: PCT/JP2014/056411
§ 371 (c)(1),
(2) Date: Jan. 13, 2016

(87) PCT Pub. No.: WO2015/118696
PCT Pub. Date: Aug. 13, 2015

(65) Prior Publication Data
US 2016/0165713 A1    Jun. 9, 2016

(30) Foreign Application Priority Data

Feb. 4, 2014  (JP) ................................ 2014-019060

(51) Int. Cl.
*H05H 1/46*   (2006.01)
(52) U.S. Cl.
CPC ........ *H05H 1/46* (2013.01); *H05H 2001/4645* (2013.01)
(58) Field of Classification Search
CPC ................ H01J 37/32091; H01J 37/32009; H01J 2237/327; H05H 1/46; H05H 2001/4645
See application file for complete search history.

(56) References Cited

U.S. PATENT DOCUMENTS

| 8,391,329 B2 | 3/2013 | Fontanella |
| 2011/0032047 A1 | 2/2011 | Yuzurihara et al. |

(Continued)

FOREIGN PATENT DOCUMENTS

| JP | 2005-129666 A | 5/2005 |
| JP | 2006-185876 A | 7/2006 |

(Continued)

OTHER PUBLICATIONS

International Search Report dated Apr. 8, 2014, issued in counterpart Application No. PCT/JP2014/056411 w/English translation (2 pages).

(Continued)

*Primary Examiner* — Jany Richardson
(74) *Attorney, Agent, or Firm* — Westerman, Hattori, Daniels & Adrian, LLP

(57) ABSTRACT

A high-frequency power supply device is provided with a plasma ignition step that supplies pulse power to ignite plasma, and drive power supply step to supply drive power for maintaining the plasma being generated. In the plasma ignition step, an ignition pulse being applied in an ignition pulse output operation is configured as including a main pulse that induces ignition, and a prepulse with lower power than the power of the main pulse and being applied at a stage prior to the main pulse. Since the ignition pulse is configured as including the main pulse and the prepulse, this enables protection of a high-frequency power source against reflected wave power, as well as reliably igniting the plasma.

6 Claims, 24 Drawing Sheets

(56) References Cited

U.S. PATENT DOCUMENTS

| | | | | |
|---|---|---|---|---|
| 2014/0049159 A1* | 2/2014 | Kumar | .................... | H05B 41/16 315/34 |
| 2014/0145642 A1* | 5/2014 | Rapson | .............. | H05B 41/2882 315/291 |
| 2015/0084509 A1* | 3/2015 | Yuzurihara | ....... | H01J 37/32082 315/111.21 |

FOREIGN PATENT DOCUMENTS

| | | |
|---|---|---|
| JP | 2011-119268 A | 6/2011 |
| JP | 2011-134636 A | 7/2011 |
| JP | 2014-2898 A | 1/2014 |
| TW | 201352076 A | 12/2013 |
| TW | 201401937 A | 1/2014 |
| WO | 2011/016266 A1 | 2/2011 |
| WO | 2013/190987 A1 | 12/2013 |

OTHER PUBLICATIONS

Written Opinion dated Apr. 8, 2014, issued in counterpart Application No. PCT/JP2014/056411 w/English translation (9 pages).
Decision of Grant a Patent dated Feb. 20, 2015, issued in counterpart Japanese Patent Application No. 2014-019060, w/English translation (6 pages).
Examination Report dated Aug. 17, 2015, issued in counterpart Taiwanese Patent Application No. 103110469, (10 pages).

* cited by examiner

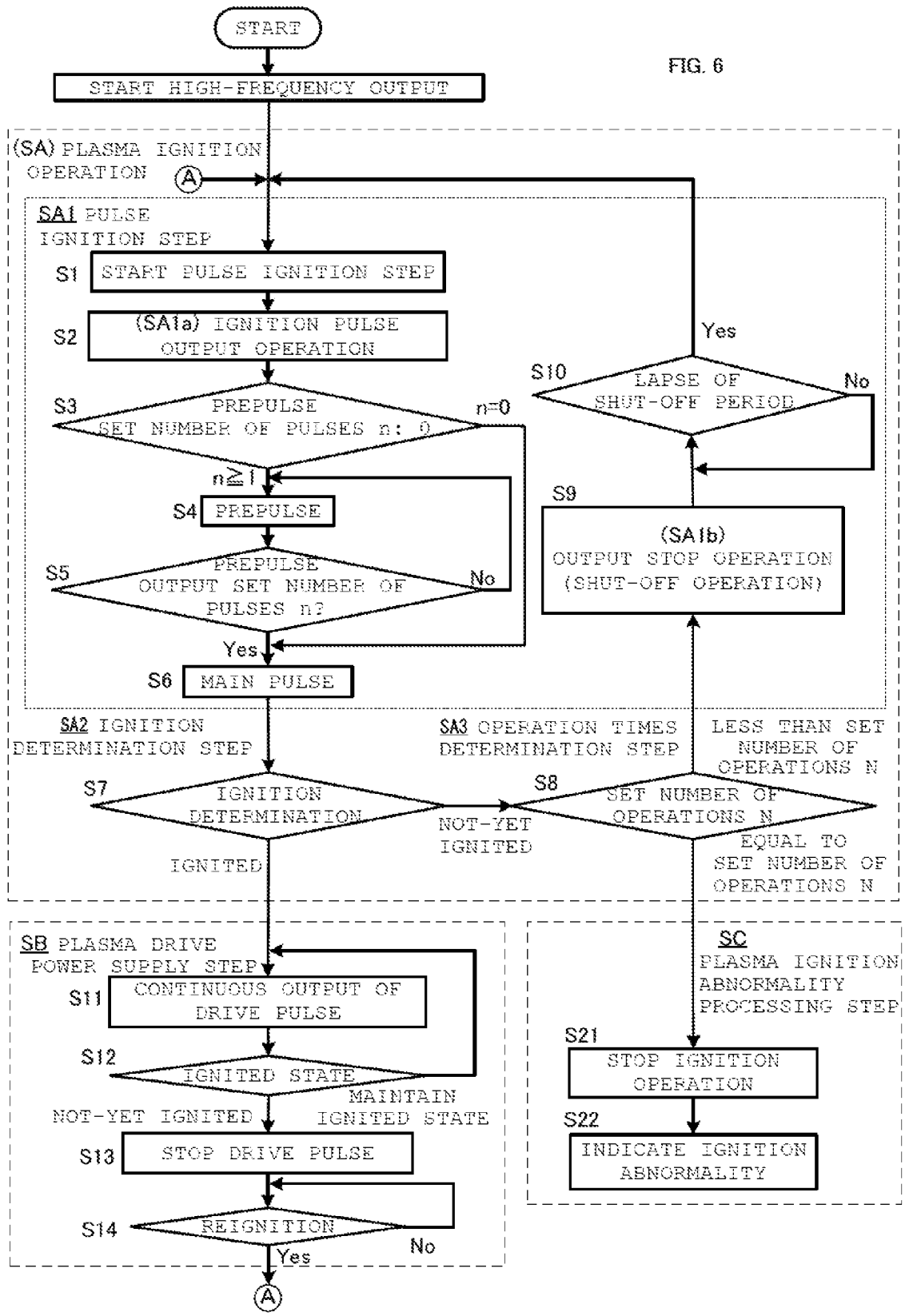

IGNITED
(LOW-FREQUENCY
PULSE MODE)
IGNITED
(HIGH-FREQUENCY
PULSE MODE)
FIG. 21A
FORWARD WAVE VOLTAGE
FIG. 21E
FORWARD WAVE VOLTAGE
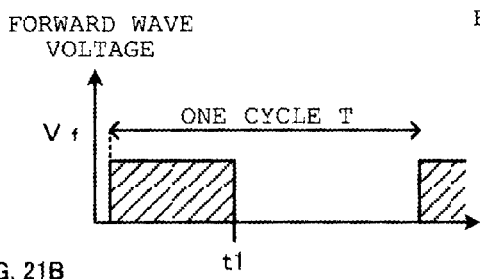
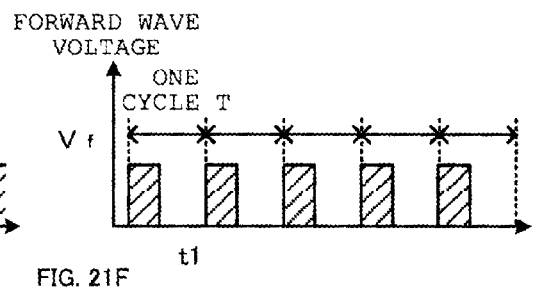
FIG. 21B
REFLECTED WAVE VOLTAGE
FIG. 21F
REFLECTED WAVE VOLTAGE
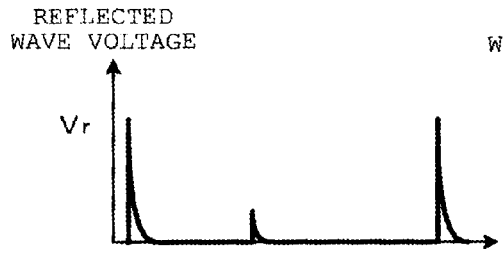
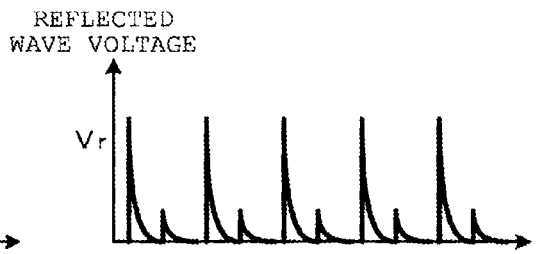
FIG. 21C
QUANTITY OF HEAT STORAGE
FIG. 21G
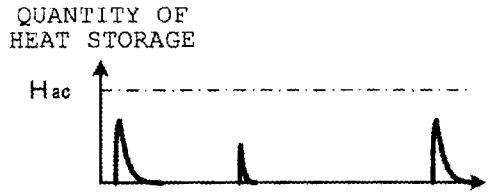
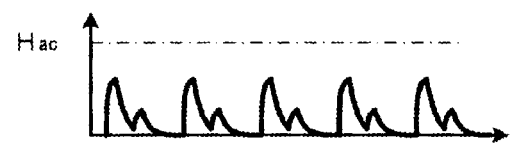
FIG. 21D
FIG. 21H
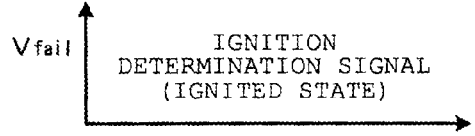
IGNITION DETERMINATION SIGNAL
(IGNITED STATE)
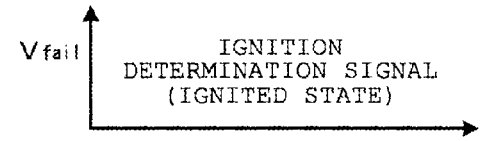
IGNITION DETERMINATION SIGNAL
(IGNITED STATE)

NOT-YET IGNITED
(LOW-FREQUENCY
PULSE MODE)

NOT-YET IGNITED
(HIGH-FREQUENCY
PULSE MODE)

HIGH-FREQUENCY POWER SUPPLY DEVICE, AND PLASMA IGNITION METHOD

TECHNICAL FIELD

The present invention relates to a high-frequency power supply device for supplying high-frequency power to a load such as plasma, and to a plasma ignition method for supplying high-frequency power to ignite plasma.

BACKGROUND ART

It is known that a plasma processing equipment such as semiconductor producing equipment and electronic device producing equipment, and a plasma generator such as a $CO_2$ laser beam machine, utilize plasma that is generated by high-frequency (RF). It is also known that plasma is generated through CW (continuous wave) drive or pulse drive of a high-frequency power source (RF power source).

FIG. 24 schematically illustrates driving of plasma load, using the high-frequency power source (RF (radio frequency) power source). In FIG. 24, pulse output delivered from the high-frequency power source (RF power source) 100 is supplied to load 102, such as a plasma processing equipment and a $CO_2$ laser beam machine, via a matching box 101, thereby generating plasma.

In generating plasma through pulse drive of the high-frequency power source (RF power source), forward wave voltage of the pulse output is intermittently supplied to the plasma load, causing a repetition of plasma on and off in the plasma load.

The pulse output according to the pulse drive of the high-frequency power source is a high-frequency (RF) output that repeats on and off at frequencies ranging from a few Hz to several hundred Hz. When the high-frequency output is switched from the on-state to the off-state, or from the off-state to the on-state, a reflected wave is generated transiently, even though the plasma is pulse driven normally. By way of example, natural oscillation of a matching box, an action of plasma ignition, or the like, may be a factor of the reflected wave occurrence, and during a period from the point when the high-frequency output is switched from the off-state to the on-state, to the point when the plasma is ignited, reflection coefficient Γ becomes approximately one (Γ≈1), and this may cause a mismatching state, leading to a total reflection state for a while. At this moment, a reflected wave is generated from the plasma load toward the high-frequency power source. At a rise of process on the plasma load side, the reflected wave power is apt to become large, typically in the state where plasma has not been ignited yet. In addition, at the time of switching from the on-state to the off-state, there may exist residual reflection until extinguishment of the high-frequency energy that is supplied during the on-state.

When the reflected wave returns to the high-frequency power source from the plasma load, a standing wave is generated, which is determined by a length of an output cable, and this may cause high voltage and large current of the reflected wave, resulting in fracture of an RF power amplifying element provided in the high-frequency power source.

In order to prevent such element fracture due to the reflected wave power, it is known that an output (forward wave power) from the high-frequency power source is drooped or reduced in response to detecting the reflected wave. Reduction of the forward wave power so as to protect the high-frequency power source against the reflected wave power leads to lowering of the voltage applied to the load, and thus, there is a problem that, depending on a recipe condition that restricts atmospheric pressure and gas types, igniting plasma may fail and disable the pulse drive.

As a configuration to ignite plasma, following prior arts are known, for instance:

(a) Configuration where an igniter device for generating discharge voltage is provided as a power source for igniting plasma, in addition to a power source that supplies drive power to the plasma in a steady state. The high-frequency power source provided with the igniter device can eliminate the need for a function of protecting a power element against the total reflected power, according to a soft-start function (Patent Document 1).

Following techniques are also known as prior arts relating to plasma ignition:

(b) Technique of reducing distance between electrodes partially, so as to induce ignition even at low power (Patent Document 2);

(c) Technique of providing a matching box connected between a high-frequency power source and a load, and according to a preset function of the matching box, displacing a matching point at a plasma ignition time when the off-state is shifted to the on-state, from the matching point during a stable power supplying time in the on-state, thereby inducing generation of ignition voltage (Patent Document 3);

(d) Technique of regulating pressure within the plasma generator to a level that induces ignition (Patent Document 4); and (e) Technique of igniting plasma during a period when average forward wave power is increased, by increasing a duty ratio of forward wave power from zero to 100% sequentially (Patent Document 5).

PRIOR ART DOCUMENT

Patent Document

Patent Document 1
Japanese Unexamined Patent Application Publication No. 2006-185876 (paragraph [0004], paragraph [0037], and paragraph [0046])
Patent Document 2
Japanese Unexamined Patent Application Publication No. 2011-134636 (paragraph [0008] and paragraph [0009])
Patent Document 3
Japanese Unexamined Patent Application Publication No. 2011-119268 (paragraph [0034], paragraph [0049], and paragraph [0050])
Patent Document 4
Japanese Unexamined Patent Application Publication No. 2005-129666 (paragraph [0029])
Patent Document 5
WO2011/016266 (paragraph [0247])

DISCLOSURE OF THE INVENTION

Problems to be Solved by the Invention

The prior arts relating to plasma ignition described above have following problems:

(a) If the igniter power source is employed, there is a problem that cost may be increased since the igniter power source is required to be prepared separately in addition to the power source for supplying power in the steady state, and furthermore, when a frequency of a pulse signal for performing pulse drive becomes higher, another igniting function becomes necessary, since the igniter power source becomes unable to cope with such high frequency;

(b) In the technique to partially reduce the distance between the electrodes, the electrode is required to be in the form that facilitates discharging by partially raising field intensity of the electrode, and thus cost of developing such form of electrode may be increased, and in addition, a breakdown electric field should be considered, because electric field is likely to be collected between the electrodes where the distance is reduced partially;

(c) In the matching box, when a matching process is performed under an impedance condition which is displaced from the matching point, the time required for impedance matching is apt to become longer, and thus there is a problem that it is not suitable for plasma processing or pulse drive being short in process, and there is another problem that when a value of plasma impedance before the ignition is significantly different from the value at the ignition time, this may cause failure of ignition; and (d) As for the regulation of pressure within the plasma generator, there is a problem that it may be time consuming, and in addition, it may constitute an obstacle to plasma processing.

As for the technique (e) for reducing the average forward wave power, it aims at eliminating unnecessary matching operation of the matching circuit, and stabilizing the plasma load (Patent Document 5, paragraph [0015]), and an object of the technique (e) is not to protect the high-frequency power source for igniting plasma, since a target of this technique is not a plasma load that increases reflected wave along with the increase of the duty ratio.

As described above, plasma ignition has a problem that if forward wave power is lowered in order to protect the high-frequency power source against reflected wave power, igniting plasma becomes difficult. There is also a problem that the techniques conventionally suggested against this difficulty in plasma ignition are not suitable for pulse-driven plasma ignition.

In order to solve the conventional problems as described above, an object of the present invention is to solve the problem that in plasma ignition according to pulse drive, igniting plasma becomes difficult when forward wave power is lowered so as to protect the high-frequency power source against reflected wave power, and accordingly, and it aims at achieving reliable ignition of plasma, along with protecting the high-frequency power source against the reflected wave power.

Means for Solving the Problems

In view of the problems above, the present invention is directed to plasma ignition that is performed by applying high-frequency power from a high-frequency power supply device, and the high-frequency power supply device is provided with a plasma ignition step that supplies pulse power to ignite plasma, and a drive power supplying step that supplies drive power for maintaining the plasma thus generated, and an ignition pulse output operation characteristically provided by the present invention solves the problems and ensures plasma ignition along with protecting the high-frequency power source against reflected wave power.

In the plasma ignition step of the present invention, the ignition pulse output operation is controlled so that average reflected wave power generated before ignition, does not exceed a range of an allowable loss of the high-frequency power supply device against the reflected wave power. An ignition pulse which is applied by the ignition pulse output operation is configured as including a main pulse that induces ignition and a prepulse that is lower in power than the main pulse and applied prior to the main pulse, thereby controlling the average reflected wave power to be in an allowable range.

Average power of the prepulse may be adjusted by a duty ratio of the pulse output that forms the prepulse. The average power is adjusted according to the duty ratio, in such a manner that the reflected wave power generated by the prepulse does not exceed a range of the average allowable loss of a power element, which is permitted during the ignition pulse output operation. The high-frequency power source is protected against the reflected wave power, by reducing the average reflected wave power in the mismatching state during the ignition operation.

In the ignition pulse output operation according to the present invention, the prepulse with power lower than the power of the main pulse is applied at a stage prior to the ignition operation using the main pulse, thereby reducing power supplied to the load and adjusting the average reflected wave power, together with forming atmosphere to facilitate plasma ignition and improving reliability of plasma ignition.

[Plasma Ignition Method of High-Frequency Power Supply Device]

A plasma ignition method of a high-frequency power supply device according to the present invention is a method of igniting plasma by applying a pulse output of high-frequency power from the high-frequency power device, the method including a plasma ignition step that ignites plasma by a pulse output delivered on an intermittent time base, and a plasma drive power supply step that supplies drive power to maintain the plasma being ignited by the plasma ignition step, thereby allowing the plasma to be maintained.

The plasma ignition step includes an ignition pulse output operation that delivers an ignition pulse to ignite plasma. Each ignition pulse delivered in the ignition pulse output operation contains optional number of prepulses and a main pulse, each prepulse having power lower than the power of the main pulse and delivered at a stage prior to the main pulse, and the main pulse being delivered initially after the prepulses. In addition to the ignition pulse output operation, an output stop operation may also be provided, which outputs neither ignition pulse nor drive pulse, within a predetermined period of time. In the case where both the ignition pulse output operation and the output stop operation are provided, the output stop operation and the ignition pulse output operation are repeated, if plasma has not been ignited yet after the first ignition pulse output operation is performed.

The prepulses are applied at a stage prior to applying the main pulse in the ignition pulse output operation, thereby forming atmosphere that facilitates igniting plasma, and improving reliability of plasma ignition. In addition, power of the prepulse is lower than that of the main pulse, and therefore, the power supplied to the load is lowered, thus reducing the average reflected wave power.

The power of the prepulse can be adjusted by a duty ratio. The duty ratio of the prepulse is set in such a manner that average reflected wave power per ignition pulse output operation for total reflected wave power generated by the pulse output of the prepulses, is in a range of the average allowable loss or less than the average allowable loss per ignition pulse output operation, of power elements that form the high-frequency power source.

During the period for performing the ignition pulse output operation, any output interval can be set for the prepulses. In the ignition pulse output operation, a pulse output of main pulse is delivered once, subsequent to the prepulses. Output of the main pulse is set in such a manner that average reflected wave power per ignition pulse output operation for total reflected wave power generated by the main pulse is in a range of the allowable loss or less than the allowable loss per ignition pulse output operation, of the power elements that form the high-frequency power source, thereby enabling protection of the power elements against the reflected wave power.

After igniting the plasma by the plasma ignition step, the step is shifted to the plasma drive power supplying step for supplying drive power to maintain thus ignited plasma.

In the plasma drive power supplying step, drive power according to a drive pulse or a continuous output is supplied to a plasma load for maintaining the plasma, when the plasma is in the state of being ignited. Any duty ratio can be selected for the pulse output of the drive pulse. Typically, the duty ratio to be selected is larger than an average duty ratio of the ignition pulse that is outputted during the ignition pulse output operation. The continuous output is implemented by a continuous drive at the duty ratio of 100%.

The high-frequency power supply device executes the pulse ignition step including the ignition pulse output operation, and the plasma drive power supplying step, thereby igniting and maintaining the plasma.

The pulse ignition step may be provided with an output stop operation (shut-off operation) that outputs neither the ignition pulse nor the drive pulse, in addition to the ignition pulse operation for outputting the ignition pulse. In determining the ignition, when it is determined that plasma has not been ignited yet after ignition according to the ignition pulse output operation, the output stop operation and the ignition pulse output operation are repeatedly performed. The repeat count is set according to a set number of operations N.

In repeating the ignition pulse output operation and the output stop operation, the count for executing the ignition pulse output operation is limited to the set number of operations N, and if plasma has not been ignited yet after executing the ignition pulse output operation for the set number of operations N, it is determined as ignition abnormality. If plasma is ignited before repeating the ignition pulse output operation for the set number of operations N, drive power is supplied so as to maintain plasma, without determined as the ignition abnormality.

The duration of the output stop operation is not necessarily equal to the duration of the ignition pulse output operation, and it may be any time length. In the plasma ignition step, an ignition pulse is formed only during the ignition pulse output operation, and pulse output is suspended during the output stop operation.

The pulse output is suspended during the output stop operation, by stopping formation of ignition pulse and drive pulse. Alternatively, it is further possible to continuously form the ignition pulse and drive pulse during the ignition pulse output operation and the output stop operation, and interrupt outputting thus formed ignition pulse and drive pulse during the output stop operation.

[High-frequency Power Supply Device]

The high-frequency power supply device of the present invention is a device to ignite plasma by applying high-frequency power, and it is provided with a pulse output section configured to deliver a pulse output being a high-frequency output.

The pulse output section is provided with an ignition pulse former configured to form an ignition pulse to ignite plasma by delivering a pulse output on an intermittent time base, and a drive pulse former configured to form a drive pulse to supply drive power for maintaining the plasma being ignited, after the plasma is ignited by the ignition pulse.

Each ignition pulse formed by the ignition pulse former includes an optional number of prepulses and a main pulse, and the prepulses having lower electrical power than the power of the main pulse, are outputted at a stage prior to the main pulse, and the main pulse is outputted initially after the prepulses. Applying the prepulses produces atmosphere that facilitates plasma forming, and thereafter, the main pulse is applied to perform plasma ignition.

The power of the prepulse is set lower than the power of the main pulse, thereby lowering the power supplied to the load and reducing the average reflected wave power. The ignition pulse former forms the pulse output of prepulse having the power that makes the average reflected wave power generated by the pulse output is equal to or less than the allowable loss of the power elements that form the high-frequency power source.

In addition, one-time pulse output of the main pulse is delivered, subsequent to the prepulses in the ignition pulse output operation. The pulse output of the main pulse is configured in such a manner that average reflected wave power per ignition pulse output operation of total reflected wave power generated by the main pulse is within a range of the average allowable loss or less than the average allowable loss per ignition pulse output operation, of the power elements that form the high-frequency power source.

Lowering the power of the prepulses and the main pulse in the state of not ignited yet can protect the power elements against the reflected wave power.

The pulse output section may be provided with an output stop section that suspends outputting the ignition pulse and drive pulse only for a predetermined period of time. After applying the ignition pulse formed by the ignition pulse former, the output stop section stops outputting of ignition pulse for a predetermined period of time, in the event of failure in igniting plasma.

In the configuration where the pulse output section is provided with the output stop section, after the first ignition pulse formed by the ignition pulse former is outputted and if the plasma has not been ignited yet, the ignition pulse section and the output stop section repeat the following; suspending the output of the ignition pulse and the drive pulse by the output stop section, and outputting the ignition pulse formed by the ignition pulse former, and then, the pulse ignition operation is performed plural number of times to ignite plasma.

After the plasma is ignited by the ignition pulse, the drive pulse former supplies drive power to maintain the ignited plasma.

The ignition pulse former and the output stop section repeat the operations of the ignition pulse output and the output stop, where the number of operations of the ignition pulse output is limited to the set number, and if plasma is not ignited after executing the ignition pulse output operations for the set number of operations, the ignition operation is stopped.

The ignition pulse former can define any output interval for the prepulses in forming the ignition pulse.

The output stop section can set any duration of time for stopping the output. The ignition pulse former forms the ignition pulse only in the ignition pulse output operation, and forming the ignition pulse and the drive pulse is stopped within the duration of time when the output is suspended according to a command from the output stop section. This suspends the output of the ignition pulse and the drive pulse.

The output stop section may stop outputting of the ignition pulse and the drive pulse according to another embodiment. In stopping the output, the output stop section is able to set any duration of time when the output is suspended, with respect to the duration of time for forming the ignition pulse. The ignition pulse former continuously forms the ignition pulse and the drive pulse, both in the period when the ignition pulse former forms the ignition pulse and in the period when the output stop section stops outputting, and outputting of the ignition pulse and the drive pulse formed during those period are shut off during the period for stopping the output. Accordingly, this suspends outputting of the ignition pulse and the drive pulse.

According to the present invention, in the ignition pulse output operation, the high-frequency power supply device applies prepulses with power lower than the power of the main pulse at a stage prior to the ignition operation by the main pulse, thereby lowering power supplied to the load and reducing the average reflected wave power. Accordingly, a function is provided to protect the RF power source against the reflected wave power, as well as forming atmosphere facilitating plasma ignition and improving reliability of plasma ignition, achieving ignition without a need of igniter device.

A duty ratio of the pulse power supplied by the plasma ignition operation is adjusted, and the number of pulses of the pulse output delivered within the ignition pulse period is defined by the set number, thereby providing a function that average reflected wave power per ignition operation period of the reflected wave power generated during the ignition pulse period is controlled to be within a range of an allowable loss, and to protect the high-frequency power source against the reflected wave power, and this enables ignition without the need of an igniter device.

By supplying ignition pulse with low power to the plasma load before ignited, the reflected wave power is applied during the ignition pulse period, in such a manner that the reflected wave power does not exceed an allowable loss of the plasma power source against the reflected wave power, and this forms atmosphere of plasma ignition. Then, plasma is ignited by the main pulse, and after ignition of the plasma the operation shifts to the drive power supplying operation.

If no ignition occurs in the plasma ignition operation, the step of ignition operation is repeated to induce the ignition.

Functions of the high-frequency power supply device according to the present invention may be applicable not only at the time of starting operation, but also at restarting, when power shutdown occurs due to abnormality of the plasma load during operation, or the like.

Advantage of the Invention

As described above, according to the plasma ignition method of the high-frequency power supply device and the high-frequency power supply device of the present invention, the high-frequency power source is protected against the reflected wave power, with achieving reliable ignition.

BRIEF DESCRIPTION OF THE DRAWINGS

FIG. 6 is a flowchart illustrating a first operation example of plasma ignition according to the high-frequency power supply device of the present invention;

FIG. 21 is a signal diagram illustrating a low frequency mode and a high frequency mode in the state being ignited;

MODE FOR CARRYING OUT THE INVENTION

Figure 17:
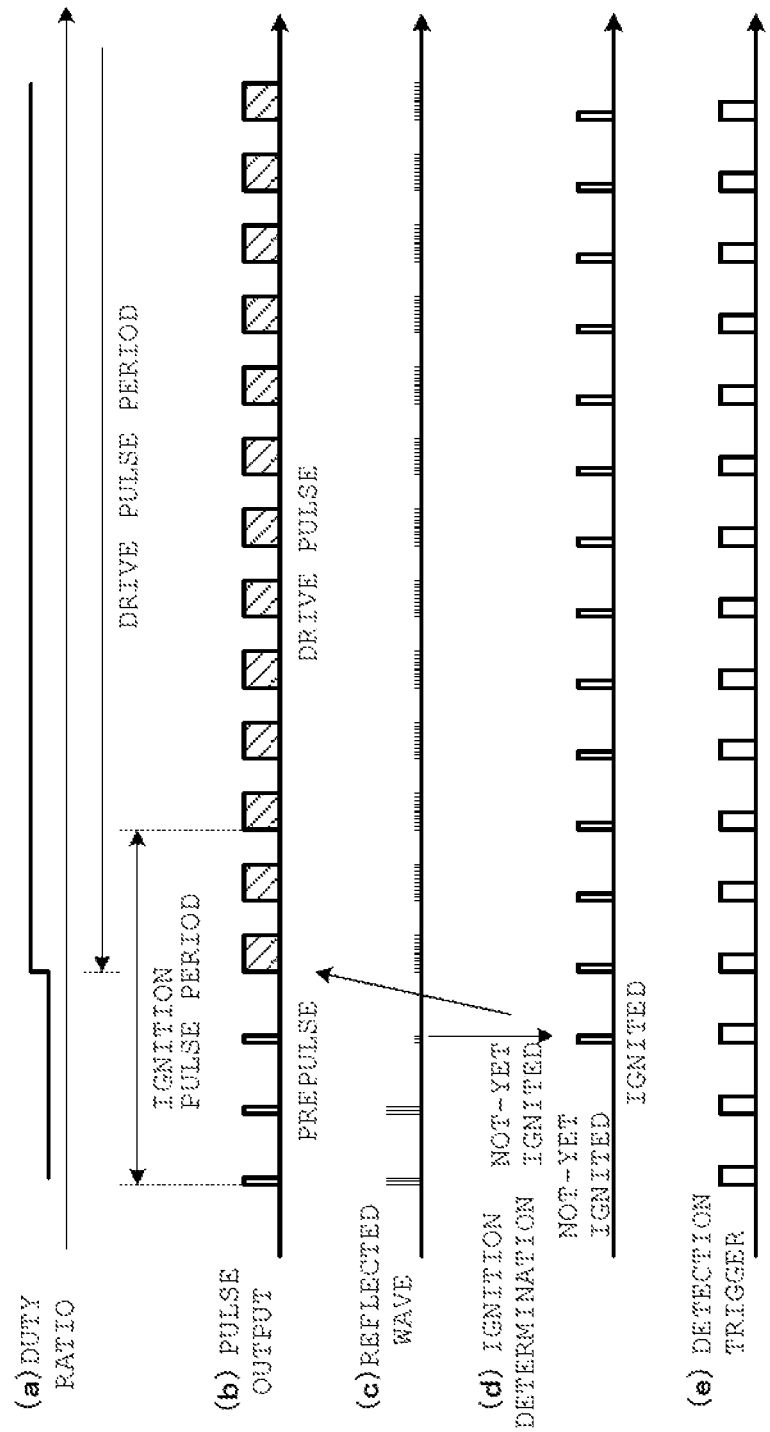
FIG. 17 is a signal diagram illustrating the second operation example of plasma ignition according to the high-frequency power supply device of the present invention.
Figure 18:
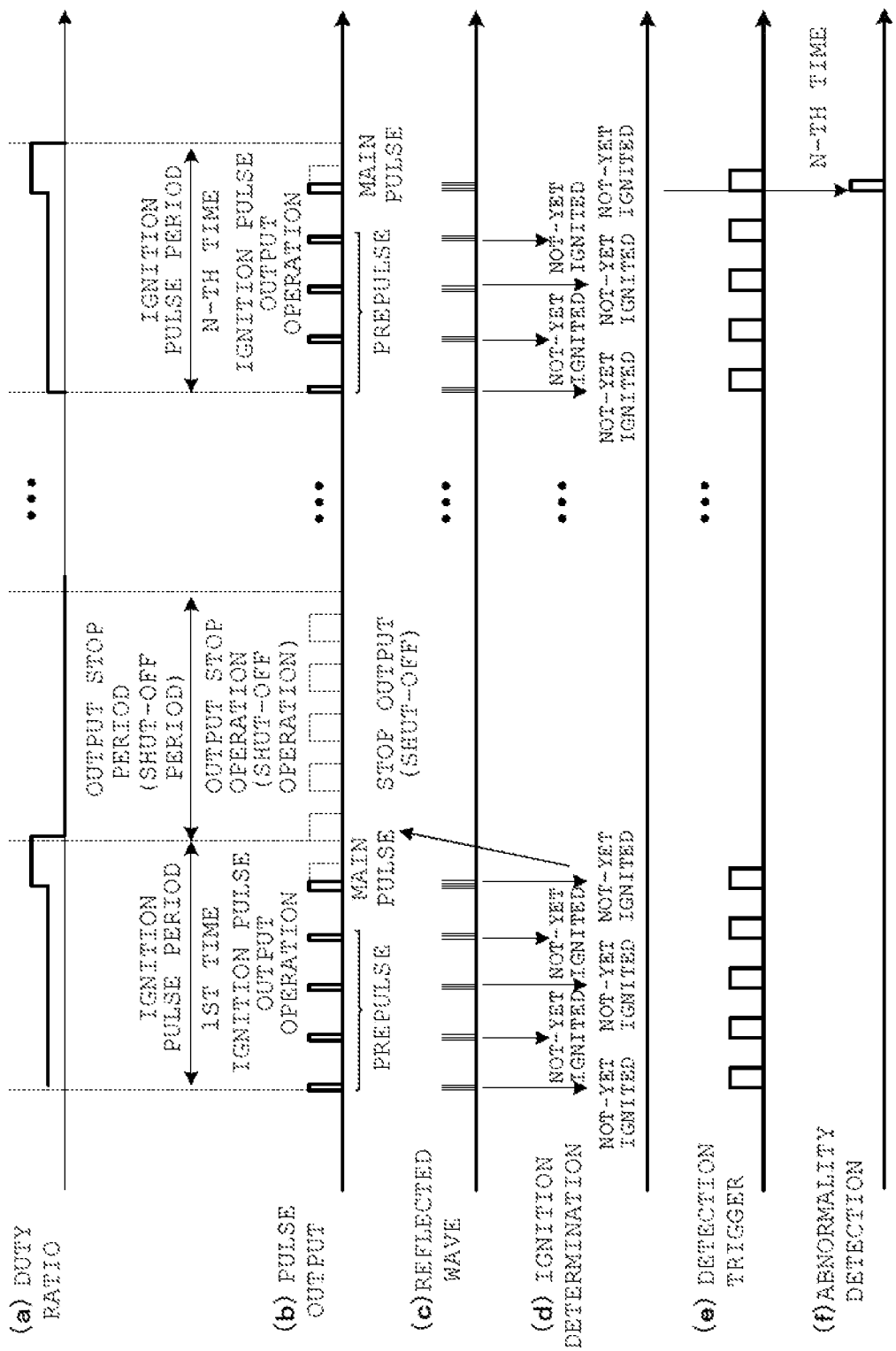
FIG. 18 is a signal diagram illustrating the second operation example of plasma ignition according to the high-frequency power supply device of the present invention.
Figure 19:
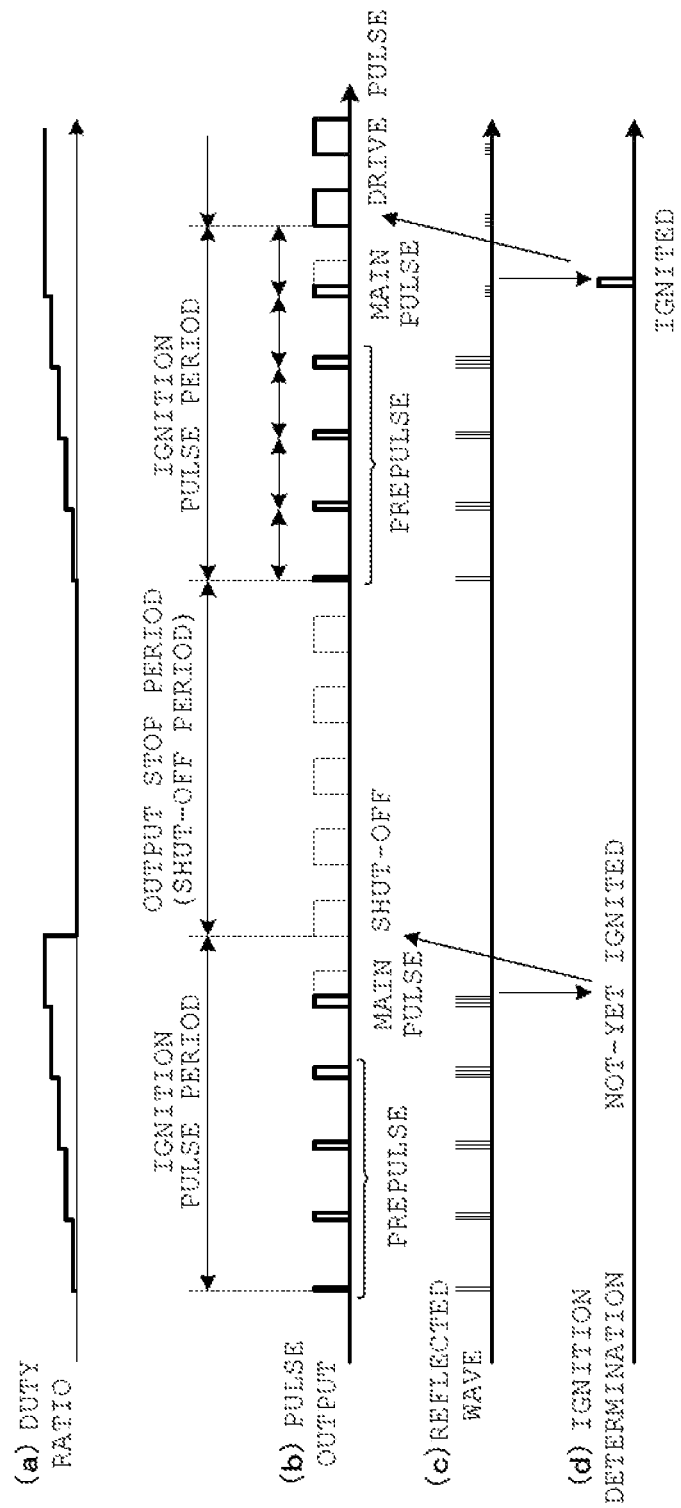
FIG. 19 is a signal diagram illustrating the case where a soft start is applied in the ignition operation period.

Embodiments of the present invention will now be described in detail with reference to the accompanying drawings. Plasma ignition according to the high-frequency power supply device of the present invention will be described as the following; schematic operations with reference to FIGS. 1 to 3; an outline configuration with reference to FIG. 4, and an outline configuration of a power controller provided in the high-frequency power supply device with reference to FIG. 5. FIGS. 6 to 18 are flowcharts and signal diagrams for describing two operation examples of the plasma ignition according to the high-frequency power supply device of the present invention. FIGS. 6 to 14 show examples for determining the ignition state at the end of the ignition operation period, and repeating the operations in the ignition operation period for the set number of ignition operations, and FIGS. 15 to 18 show the examples for determining the ignition state during the ignition operation period and repeating the operations in the ignition operation period for the set number of ignition operations. FIG. 19 illustrates the case where a soft start is employed in the ignition operation period, and FIGS. 20 to 23 illustrate one configuration example for determining the ignition state.

In the operation for generating plasma according to the high-frequency power supply device of the present invention, as a pulse output delivered from the high-frequency power supply device, there are provided an ignition pulse being a pulse output for igniting plasma in the ignition pulse output step, and a drive pulse for generating plasma steadily after it is ignited in the plasma drive power supplying step. The pulse output of the ignition pulse includes a main pulse, and a prepulse that is outputted at a stage prior to the main pulse.

[Schematic Operation of Plasma Ignition by the High-Frequency Power Supply Device]

A high-frequency output (RF output) is supplied from a high-frequency power supply (RF power source) device according to pulse drive, to a plasma load of a plasma processing equipment, such as semiconductor processing equipment and electronic device processing equipment, or of a plasma generator such as a $CO_2$ laser beam machine. The pulse drive is controlled by a control signal that is turned on and off according to pulse signals at predetermined intervals, and high-frequency power is supplied to the load during the on-time, and supplying high-frequency power is suspended during the off-time. Then, according to the duty ratio (time ratio) of on and off, the power supplied to the load is controlled. A power controller controls the pulse drive. The interval of the pulse signals for the pulse drive may be set in accordance with a frequency of a high-frequency output (RF output) that is supplied to the plasma load.

In the pulse drive for the plasma load according to the high-frequency power supply device, ignition of the plasma load can be determined by a power sensor which is connected between the high-frequency power supply device (RF power source) and the plasma load, the power sensor detecting voltage of forward wave power that travels from the high-frequency power supply device to the plasma load (forward wave voltage $V_f$) and voltage of the reflected wave power (reflected wave voltage $V_r$) returning from the plasma load to the high-frequency power supply device (RF power source $V_r$).

The power controller of the high-frequency power supply device controls the pulse drive, on the basis of the forward wave voltage $V_f$ and the reflected wave voltage $V_r$ detected by the power sensor. By way of example, in the case where the plasma is ignited normally, the duty ratio is controlled so that the forward wave voltage $V_f$ becomes a predetermined voltage, on the basis of the forward wave voltage $V_f$ that is detected by the power sensor. On the other hand, in the case where the plasma is in the abnormal state, the power controller controls the high-frequency output to droop, and in addition, performs control to suspend outputting power, thereby preventing damage to the high-frequency power supply device by the reflected wave power.

Figure 1:
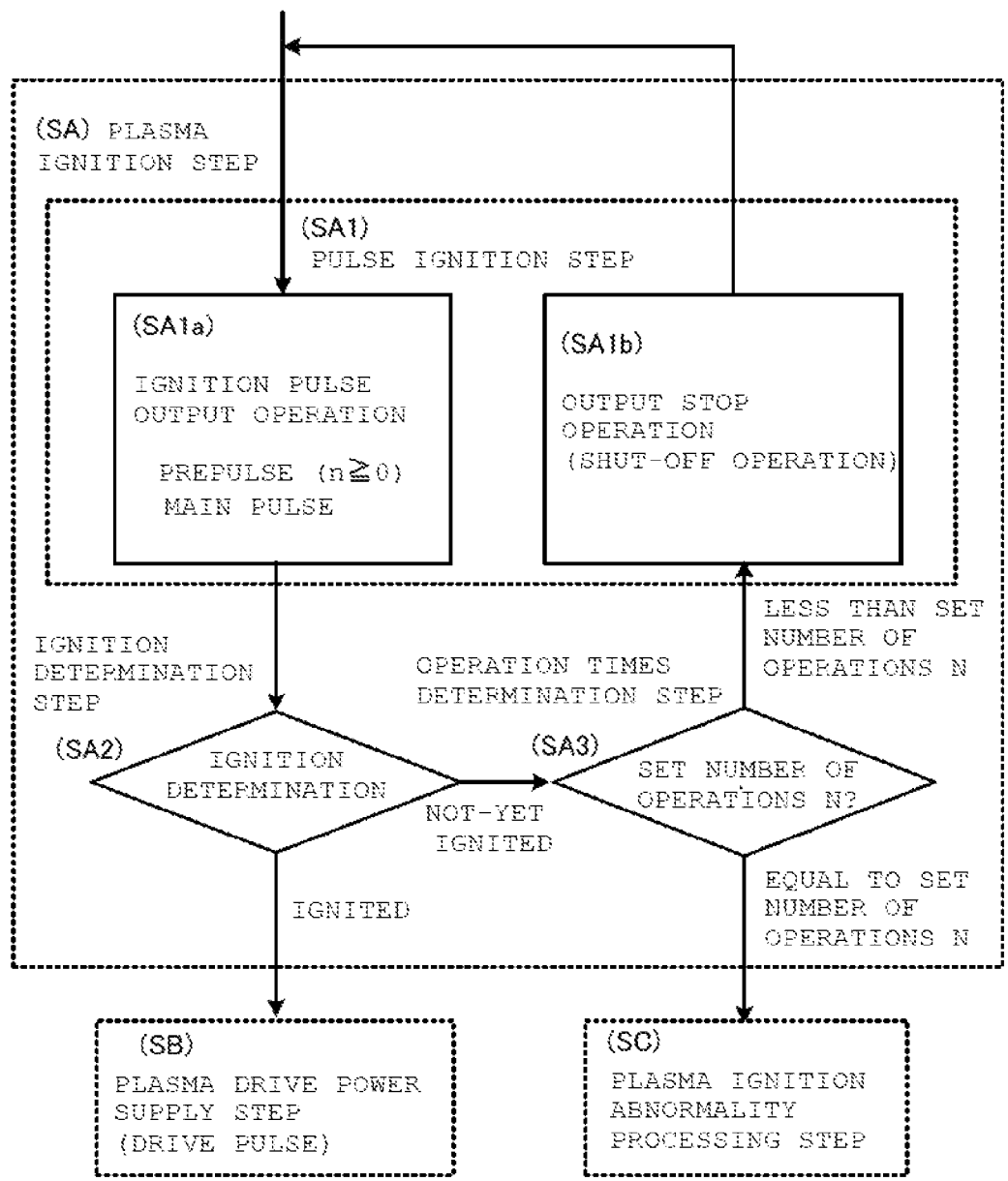
FIG. 1 is a block diagram schematically illustrating plasma ignition according to a high-frequency power supply device of the present invention.
Figure 2:
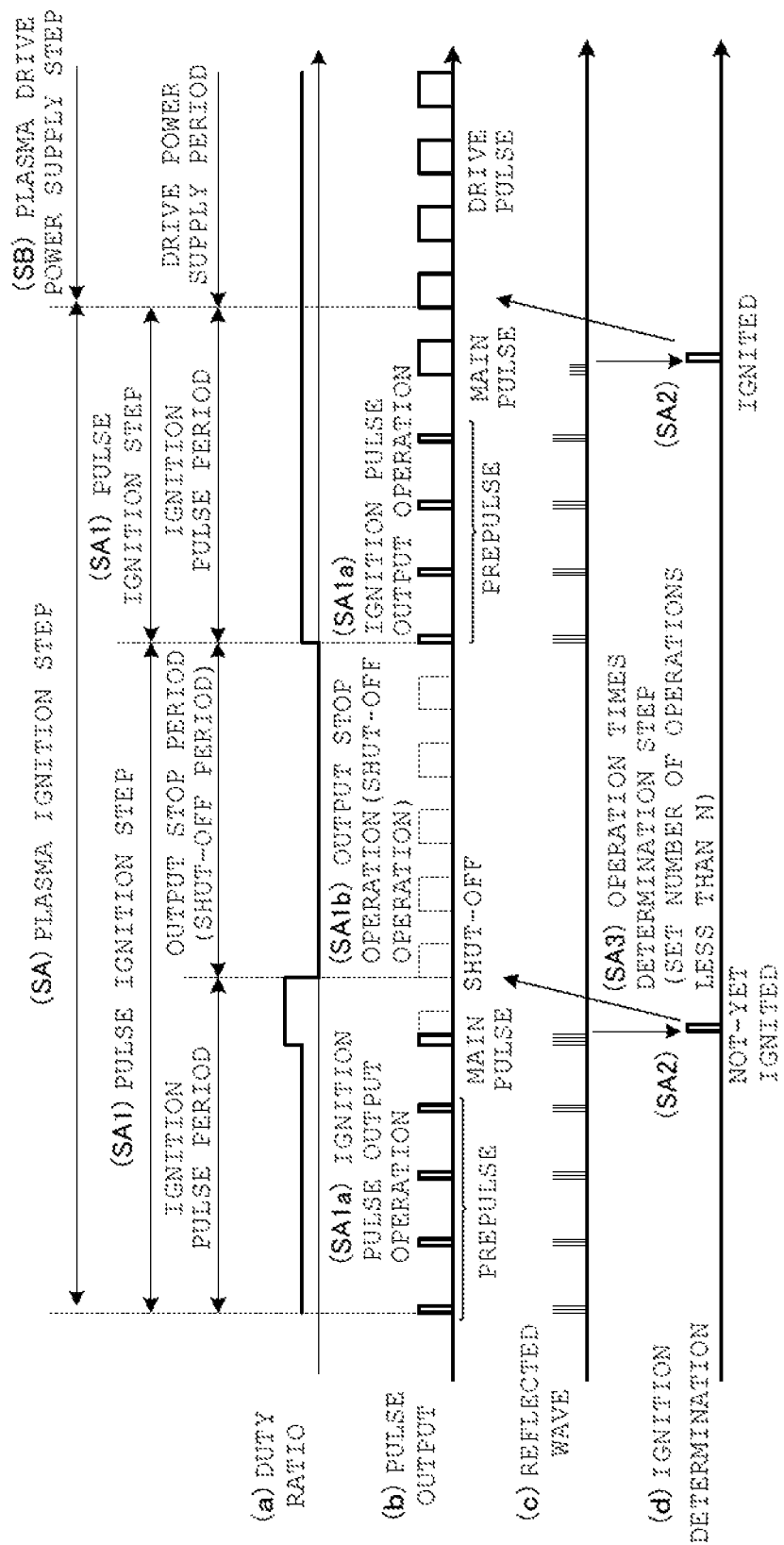
FIG. 2 is a signal diagram schematically illustrating plasma ignition according to the high-frequency power supply device of the present invention.
Figure 3:
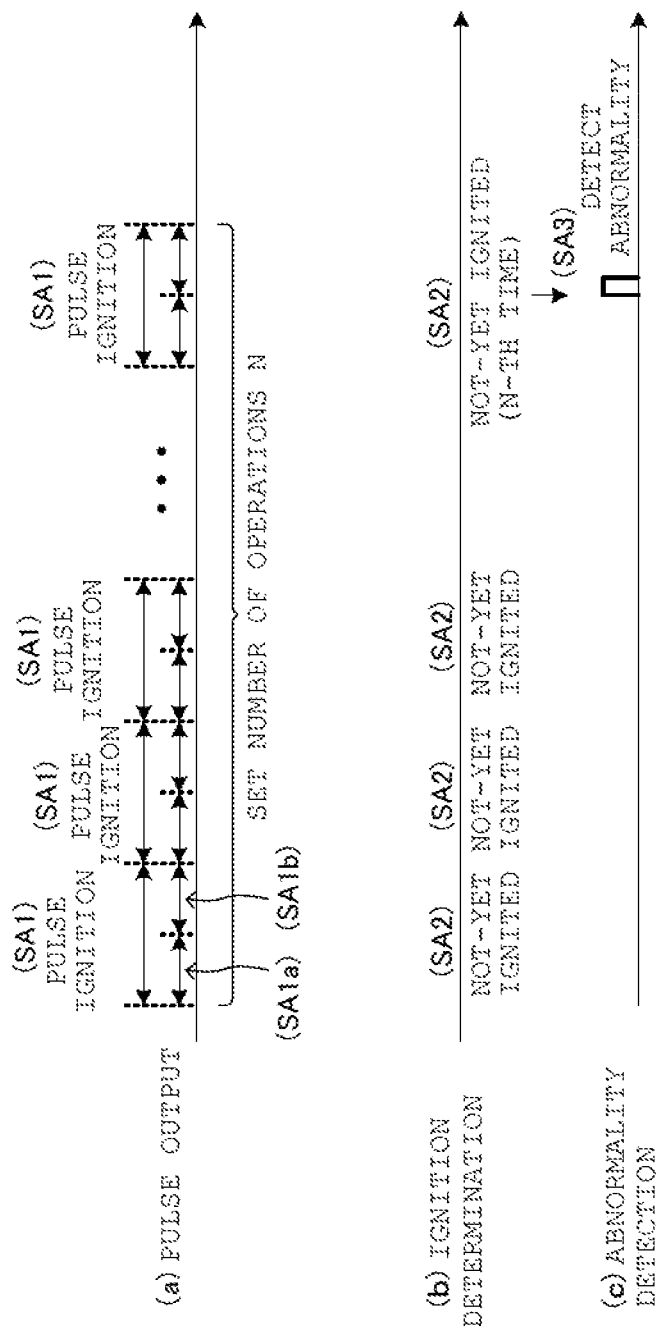
FIG. 3 is a signal diagram illustrating an outline configuration of the high-frequency power supply device of the present invention.

FIGS. 1 to 3 illustrate the operations to ignite plasma by applying high-frequency power from the high-frequency power supply device. The notations such as (SA) to (SC), (SA1a), (SA1b), (SA2), and (SA3) respectively represent the operations as shown in FIGS. 1 to 3. FIG. 2(a) shows a duty ratio of the pulse output in the operating state during the ignition pulse period and the output stop period, FIG. 2(b) shows the pulse output. FIG. 2(c) shows a reflected wave, and FIG. 2(d) shows determination of ignition.

FIG. 2 illustrates the case of ignited, after the state of not yet ignited, and FIG. 3 illustrates the case where the plasma is not-yet ignited with no occurrence of ignition, after repeating the ignition pulse output operation step for N times, and it is detected as an abnormal state according to the determination that the state has not been ignited yet.

In supplying power to the plasma load, the high-frequency power supply device of the present invention performs plasma ignition according to the plasma ignition step (SA), and supplies drive power to the plasma being ignited according to the plasma drive power supplying step (SB), so as to maintain the plasma. At the time when the ignition is abnormal, the ignition abnormality processing step (SC) stops the power supply and indicates abnormality. The plasma ignition abnormality processing step (SC) may be applicable not only in the plasma ignition step (SA), but also in the plasma drive power supplying step (SB).

The plasma ignition step (SA) includes the pulse ignition step (SA1), the ignition determination step (SA2), and the operation times determination step (SA3). The pulse ignition step (SA1) is provided with a pulse ignition output operation (SA1a) to apply a pulse output of high-frequency power on an intermittent time base, as an ignition pulse to ignite plasma, and an output stop operation (SA1b) to stop outputting the ignition pulse. The ignition pulse output operation (SA1a) outputs the ignition pulse during the ignition pulse period. The output stop operation (SA1b) stops outputting of the ignition pulse and the drive pulse during the output stop period, and the pulse output is not delivered to the load (FIG. 2(b)). In the pulse output as shown in FIG. 2(b), a pulse width of the main pulse in the ignition pulse output operation (SA1a) is smaller than the pulse width of the drive pulse. In the figure, the main pulse is indicated by a solid line, and the pulse corresponding to the drive pulse is indicated by a broken line. Also in FIG. 2(b), the pulse indicated by the broken line during the output stop operation (shut-off operation) (SA1b) represents a drive pulse in the state where the output is stopped. In the following FIGS. 8 to 14, 16, and 18 to 19, the solid line and broken line during the ignition pulse output operation and during the output stop operation (shut-off operation), represent the main pulse and the drive pulse, similar to FIG. 2(b).

In the plasma ignition step (SA), the ignition pulse outputted by the ignition pulse output operation (SA1a) during the ignition pulse period, is high-frequency power as one pulse output, delivered intermittently at a predetermined duty ratio, and the ignition pulse includes a prepulse and a main pulse. The prepulse has power lower than the power of the main pulse, and the prepulse is outputted at a stage prior to the main pulse. It is possible to adjust power of the prepulse and the main pulse by the duty ratio of the pulse output (FIG. 2(a)).

The prepulse may be made up of pulse output, the number of which corresponds to the set number of pulses n, which is predetermined within the ignition pulse period. The set number of pulses n may be any number, and an output cycle of each prepulse may be defined optionally.

The set number of pulses n of the prepulse may be equal to zero or more. When the set number of pulses n is set to "zero", the ignition pulse outputted within the ignition pulse period may be only one main pulse. The main pulse may have power being equal to the power of the drive pulse outputted in the plasma drive power supplying step (SB), and in addition, the main pulse may have power larger than the drive pulse, within the range that reflected wave power does not damage a power element. The power of the main pulse and drive pulse can be adjusted by the duty ratio of the pulse output, as in the case of the prepulse.

When the set number of pulses n is "1", one prepulse and one main pulse are outputted as the ignition pulse. When the set number of pulses n is two or more, plural prepulses and one main pulse are outputted as the ignition pulse.

The duty ratio of the prepulse and the main pulse constituting the ignition pulse is set in such a manner that average reflected wave power per ignition pulse period of total reflected wave power generated by the pulse output corresponding to the set number of pulses n, is within a range of or less than an average allowable loss per ignition pulse period, of the power elements that form the high-frequency power supply device, and accordingly, damage to the power elements due to the reflected wave power can be prevented, along with facilitating plasma ignition.

The average reflected wave power is an average of the reflected wave power within the ignition pulse period, the reflected wave power being generated by the pulse output being delivered during the ignition pulse period. There is a positive correlation between the average reflected wave power, and increase and decrease of the duty ratio, and the larger becomes the duty ratio, the larger is the average reflected wave power, whereas the smaller is the duty ratio, the smaller is the average reflected wave power.

An average loss is obtained by averaging loss components within the ignition pulse period, of the high-frequency power elements provided in the high-frequency power supply device, the loss being caused by the pulse output being delivered during the ignition pulse period, and the average allowable loss is an average loss which is acceptable by the high-frequency power elements.

In the case where the average reflected wave power exceeds a range of the allowable loss, the reflected wave power may cause a failure of the high-frequency power supply device. By setting the average reflected wave power to be in the range of the average allowable loss or less than the average allowable loss, according to the duty ratio, it is possible to prevent damage to the power elements of the high-frequency power supply device, due to the reflected wave power that is generated by the state not yet ignited, in the ignition pulse output operation during the ignition pulse period.

As a result of the ignition pulse output operation during the ignition pulse period, if it is determined that the plasma has not been ignited yet, outputting the ignition pulse and drive pulse is stopped during the output stop period (shut-off period) subsequent to the ignition pulse period, according to the present invention. Providing the output stop period (shut-off period) subsequent to the ignition pulse period may allow the ignition operation to be performed on an ignition pulse period basis. Therefore, it is possible to avoid a problem that when the pulse output is delivered continuously, the reflected wave power is accumulated and exceeds the allowable loss range, causing a failure of the power elements of the high-frequency power supply device.

Duration of time of the output stop period (shut-off period) for performing the output stop operation (shut-off operation) (SA1b), may be equal to the ignition pulse period, or any duration of time is applicable. In the shut-off operation, the prepulse and main pulse are formed also in the shut-off period, similar to the ignition pulse period, and stops outputting of thus formed prepulse and main pulse, along with stopping the output of drive pulse formed during this period, or alternatively, the shut-off operation stops forming the prepulse, main pulse, and drive pulse during the shut-off period, and accordingly, application of ignition pulse to the load is stopped.

It is possible to determine whether or not ignition has occurred by the ignition pulse output operation, according to a pulse-based reflected wave, for instance. When it is determined that the plasma is ignited (SA2), the plasma ignition step (SA) is shifted to the plasma drive power supplying step (SB) at the second determination of ignition (FIG. 2(d)), and a drive pulse is outputted to the plasma load, so as to supply plasma drive power for maintaining the plasma. In the plasma drive power supplying step (SB), the duty ratio is controlled on the basis of the reflected wave voltage returning from the plasma load to the high-frequency power supply device side, thereby controlling the plasma drive power.

In determining ignition, when it is determined that the plasma has not been ignited yet in the ignition pulse output operation (SA1a) (SA2), the output stop operation shuts off outputting of the ignition pulse and the drive pulse (SA1b) during the state not yet ignited (FIG. 2(d)), and thereafter, the ignition pulse output operation (SA1a) is performed again. The ignition can be determined on the basis of the power of the reflected wave of the main pulse (FIG. 2(c)) in the ignition pulse that is delivered again.

The ignition pulse output operation (SA1a) and the output stop operation (SA1b) are executed repeatedly, and the ignition pulse output operation is performed for the set number of operations N at the maximum (SA2) (FIG. 3(b) and FIG. 3(c)). When it is determined that a result of the ignition operation performed over the set number of operations N indicates continuous state of not-yet ignited (FIG. 3(b)), the plasma ignition step (SA) is terminated, and plasma ignition abnormality is outputted (SC) (FIG. 3(c)).

In the plasma drive power supplying step (SB), supplying of drive power for maintaining the plasma, may be performed by pulse drive that delivers the pulse output as a drive pulse, having a duty ratio larger than an average duty ratio of the ignition pulse in the ignition pulse period, or by continuous drive that delivers continuous output corresponding to the duty ratio of 100%. On the basis of the determination result of the plasma ignition state, the drive pulse or the continuous output are applied to supply drive power for maintaining the plasma load being ignited.

The following table schematically shows relations among the ignition operation, determination of ignition, and drive power supplying operation in an outline operation of the aforementioned plasma ignition.

TABLE 1

| Ignition Operation | Determination of ignition | Drive power supplying operation |
|---|---|---|
| Prepulse (n times) (n ≥ 0) Main pulse (one time) | Ignited Not-yet Ignited | Drive power supplying operation Ignition operation < N times Stop output (shut-off supply) Re-ignition Ignition operation = N times Detect Abnormality |

In the table above, when the set number of pulses n of prepulse is "zero", one main pulse is outputted as the ignition pulse, and when the set number of pulses n is "one or more", n prepulses and one main pulse are outputted as the ignition pulse. In determining the ignition according to the ignition pulse, if it is determined that the plasma is ignited, a drive pulse is outputted to supply drive power. On the other hand, in determining the ignition according to the ignition pulse, if it is determined that the plasma has not been ignited yet, the output stop and reignition are repeated, and if the plasma is not ignited even after the ignition operation is performed for the set number of operations N, abnormality process is performed without performing reignition.

[Outline Configuration of the High-Frequency Power Supply Device]

Figure 4:
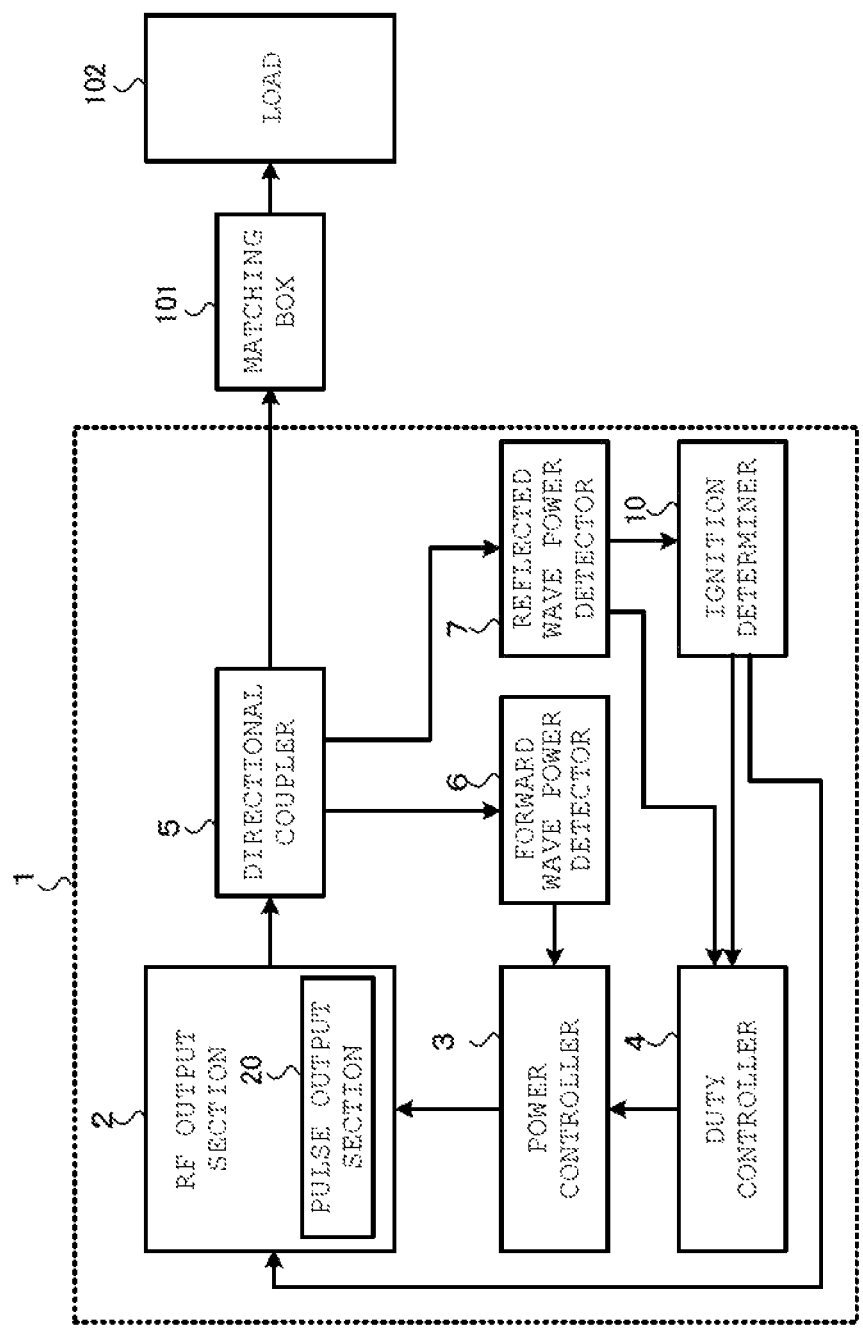
FIG. 4 is a block diagram illustrating the outline configuration of the high-frequency power supply device of the present invention.

FIG. 4 schematically illustrates one configuration of the high-frequency power supply device according to the present invention. The high-frequency power supply device 1 is provided with a high-frequency output section 2 that delivers a pulse output being a high-frequency output, and delivers the high-frequency output to the load 102 via a matching box 101 for matching an impedance. Plasma load generated within a chamber may be serve as the load 102, for instance.

The RF output section 2 is provided with a pulse output section 20, which supplies a high frequency output (RF output) according to pulse drive. The pulse drive is controlled by a control signal that is turned on and off by a pulse signal at a predetermined cycle. High-frequency power is supplied to the load during the on-time, and supplying of high-frequency power is stopped during the off-time. Accordingly, the on-and-off duty ratio (time ratio) controls the power to be supplied to the load. A power controller 3 controls the pulse drive.

The high-frequency output is generated by applying pulse modulation to DC power. The DC power is obtained from a DC power source, or it may be obtained by applying AC-DC conversion to AC power. Power transfer between the high-frequency output section 2 and the load 102 is performed bi-directionally, and forward wave power is supplied from the high-frequency output section 2 to the load 102, whereas reflected wave power is returned from the load 102 to the high-frequency output section 2. According to a balance between the forward wave power and the reflected wave power, load power is supplied from the high-frequency output section 2 to the load 102.

As a typical configuration for generating a high-frequency wave, the high-frequency power supply device 1 is provided with the power controller 3 configured to control a high-frequency output from the high-frequency output section 2, and a duty controller 4 configured to control the duty ratio for the duty control that is performed by the power controller 3. In addition to the aforementioned configuration, the high-frequency power supply device 1 is further provided with a forward wave power detector 6 configured to detect forward wave power, a reflected wave power detector 7 configured to detect reflected wave power, and a directional coupler 5 configured to separate the forward wave power from the reflected wave power for extracting each of them.

The directional coupler 5 separates the forward wave power from the reflected wave power, and inputs the forward wave power into the forward wave power detector 6, and inputs the reflected wave power into the reflected wave power detector 7. The duty controller 4 controls the duty ratio on the basis of the reflected wave power inputted from the reflected wave power detector 7. The power controller 3 performs duty control on the high-frequency output section 2, on the basis of the forward wave power inputted from the forward wave power detector 6, and a control signal inputted from the duty controller 4.

The high-frequency power supply device 1 of the present invention is provided with an ignition determiner 10, as a configuration for determining the ignited state of plasma, and the duty controller 4 performs the duty control on the basis of a result of the determination obtained by the ignition determiner 10. Then, the plasma ignition operation is made to continue, or the plasma ignition operation is shifted to the plasma drive power supplying operation. On the basis of a result of determination, ignited or not yet ignited, according to the ignition determiner 10, the pulse output section 20 changes the operation from the plasma ignition operation, to a process stop operation or the plasma drive power supplying step.

Figure 5:
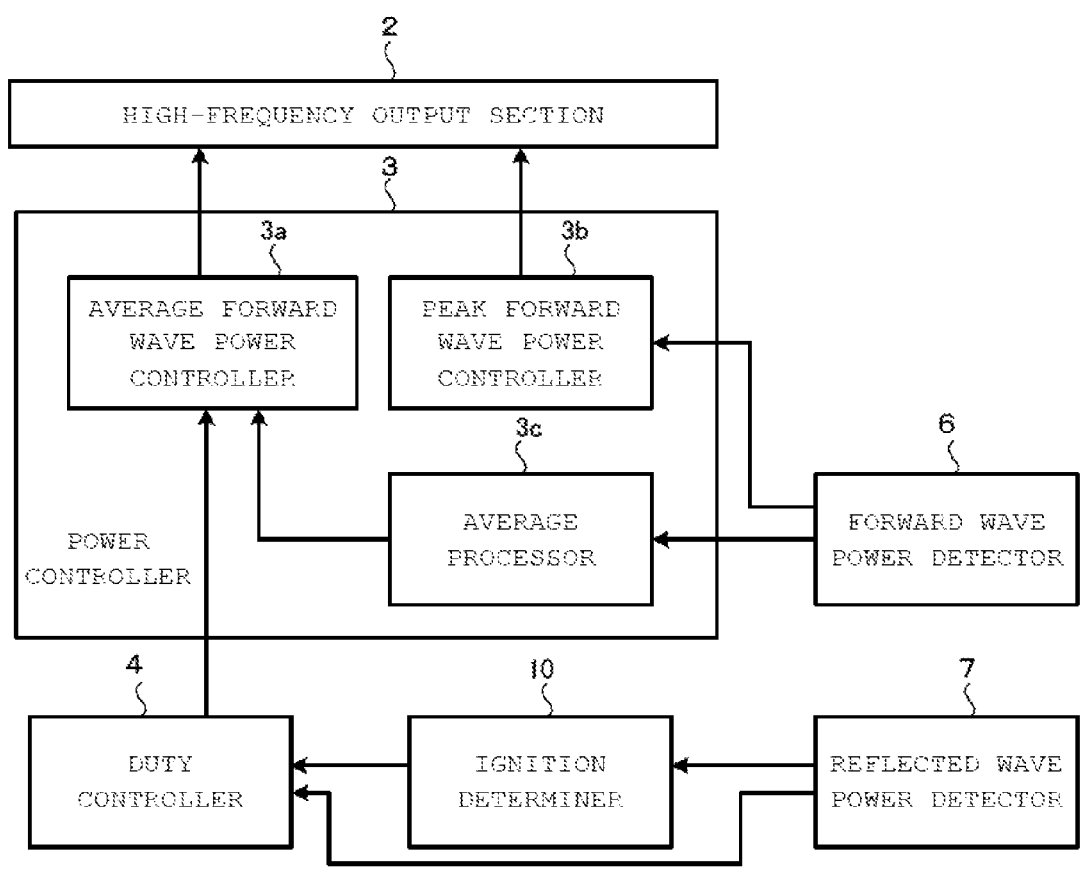
FIG. 5 is a block diagram illustrating an outline configuration of a power controller provided in the high-frequency power supply device of the present invention.

FIG. 5 is a schematic view illustrating one configuration of the power controller provided in the high-frequency power supply device 1 of the present invention. The power controller 3 may be provided with an average forward wave power controller 3a, a peak forward wave power controller 3b, and an average processor 3c.

The average processor 3c obtains average forward wave power from peak forward wave power that is detected by the forward wave power detector 6, and thus obtained average forward wave power is fed back to the average forward wave power controller 3a.

The forward wave power detector 6 sends a value of the detected peak forward wave power to the peak forward wave power controller 3b, and simultaneously sends the value of the detected peak forward wave power to the average processor 3c. The average processor 3c sends the obtained average forward wave power to the average forward wave power controller 3a.

The reflected wave power detector 7 sends a value of the detected peak reflected wave power to the duty controller 4, and in accordance with fluctuation of the reflected wave power, the duty controller 4 changes a duty ratio of the duty control that is performed by the average forward wave power controller 3a.

The average forward wave power controller 3a compares a value of the average forward wave power from the average processor 3c as a feedback value, with an average forward wave power command value, and performs the duty control so that the value of the average forward wave power becomes the average forward wave power command value.

The average forward wave power controller 3a performs continuous output control, assuming the duty ratio (ON duty $D_{on}$) as 100% under normal conditions, and adjusts the duty control by the control signal transferred from the duty controller 4, thereby switching between the continuous output control and the pulse output control. The continuous output control is a mode of control with the duty ratio (ON duty $D_{on}$) of 100% in the duty control, and the pulse output control is a mode of control in which the duty control is performed with the duty ratio (ON duty $D_{on}$) being less than 100%.

This adjustment of the duty control switches the duty ratio (ON duty $D_{on}$) from 100% to a predetermined value less than 100%, when the peak reflected wave power increases, for instance, and switches from the continuous output control to the pulse output control, thereby reducing the average reflected wave power and protecting the power source. In this adjustment of the duty control, the peak forward wave power is controlled to be constant, and therefore, matching operation by the matching box 101 is stabilized, and thus power injection into a chamber is also stabilized.

An operation example of the ignition operation of the high-frequency power supply device will now be described, with regard to the first operation example and the second operation example having different determination timing of the plasma ignition state.

In the first operation example, plasma ignition is determined by a reflected wave of a main pulse. When it is determined that plasma is in the ignited state, by the reflected wave of the main pulse, the process is shifted to the plasma drive power supplying step and a drive pulse is outputted. On the other hand, when it is determined that the plasma has not been ignited yet, the process is shifted to the output stop operation, and subsequently the pulse ignition step is performed again. When the number of execution times of the ignition pulse output operation reaches a predetermined set number of operations N, an abnormality processing is performed.

In the second operation example, plasma ignition is determined by reflected waves of both a prepulse and a main pulse. When it is determined that plasma is in the ignited state, by the reflected wave of the prepulse, the process is shifted to the plasma drive power supplying step and a drive pulse is outputted, without waiting for the main pulse to be outputted. On the other hand, when it is determined that plasma has not been ignited yet, the process is shifted to the output stop operation, and subsequently the pulse ignition step is performed again. When the number of execution times of the ignition pulse output operation reaches a predetermined set number of operations N, an abnormality processing is performed. In the following, operations after outputting of the high-frequency (RF) output is started will be described.

[First Operation Example of the Ignition Operation in the High-Frequency Power Supply Device]

Figure 8:
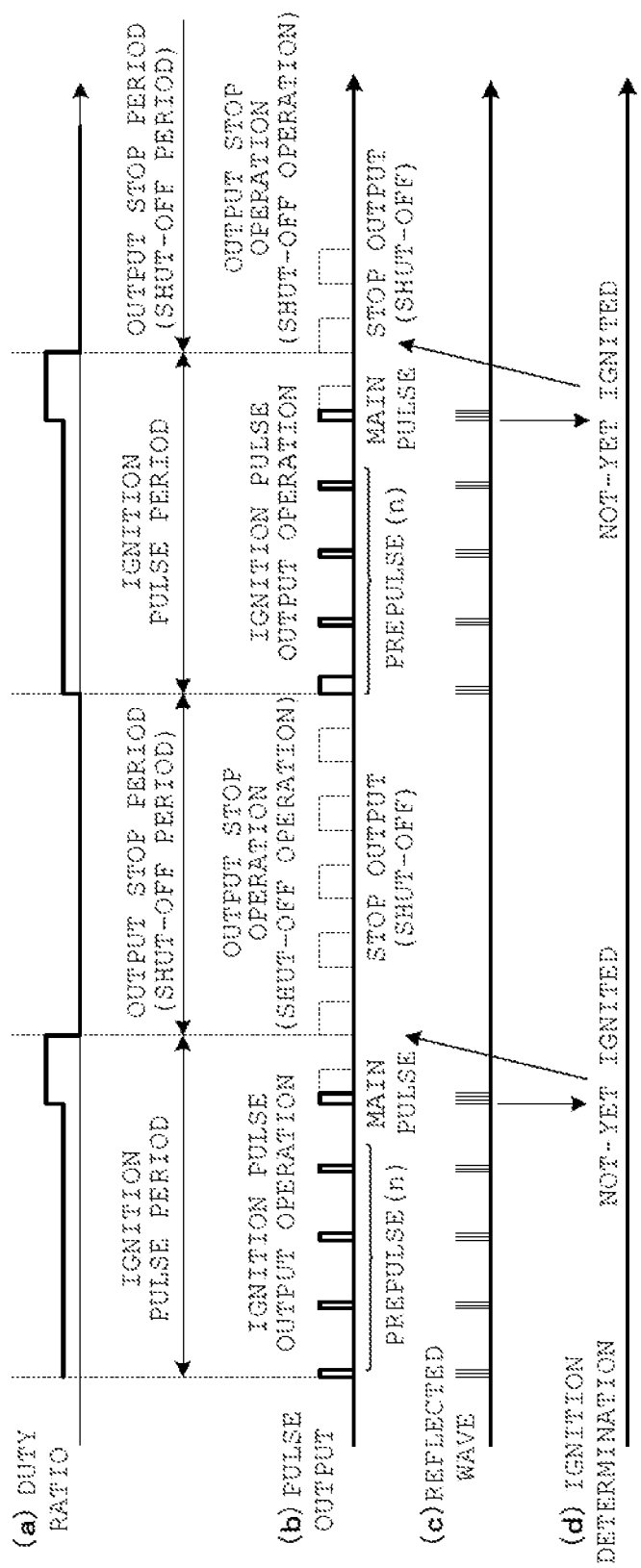
FIG. 8 is a signal diagram illustrating the first operation example of plasma ignition according to the high-frequency power supply device of the present invention.
Figure 9:
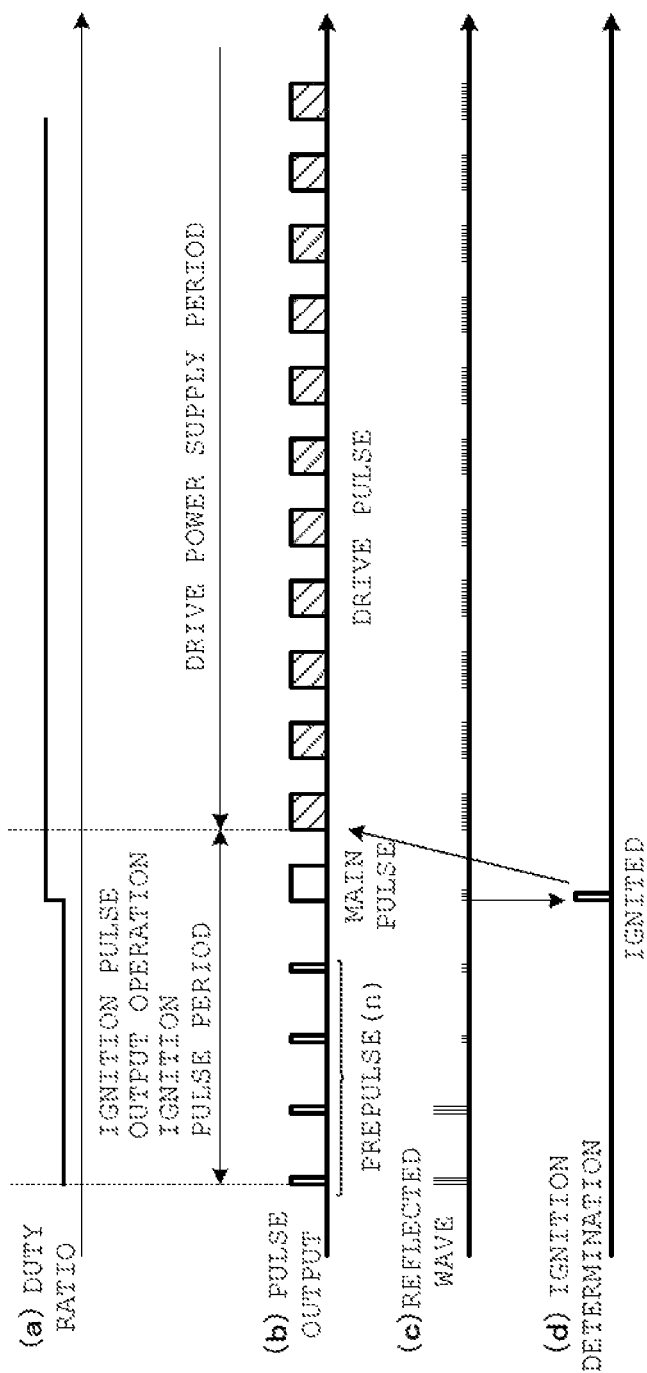
FIG. 9 is a signal diagram illustrating the first operation example of plasma ignition according to the high-frequency power supply device of the present invention.
Figure 10:
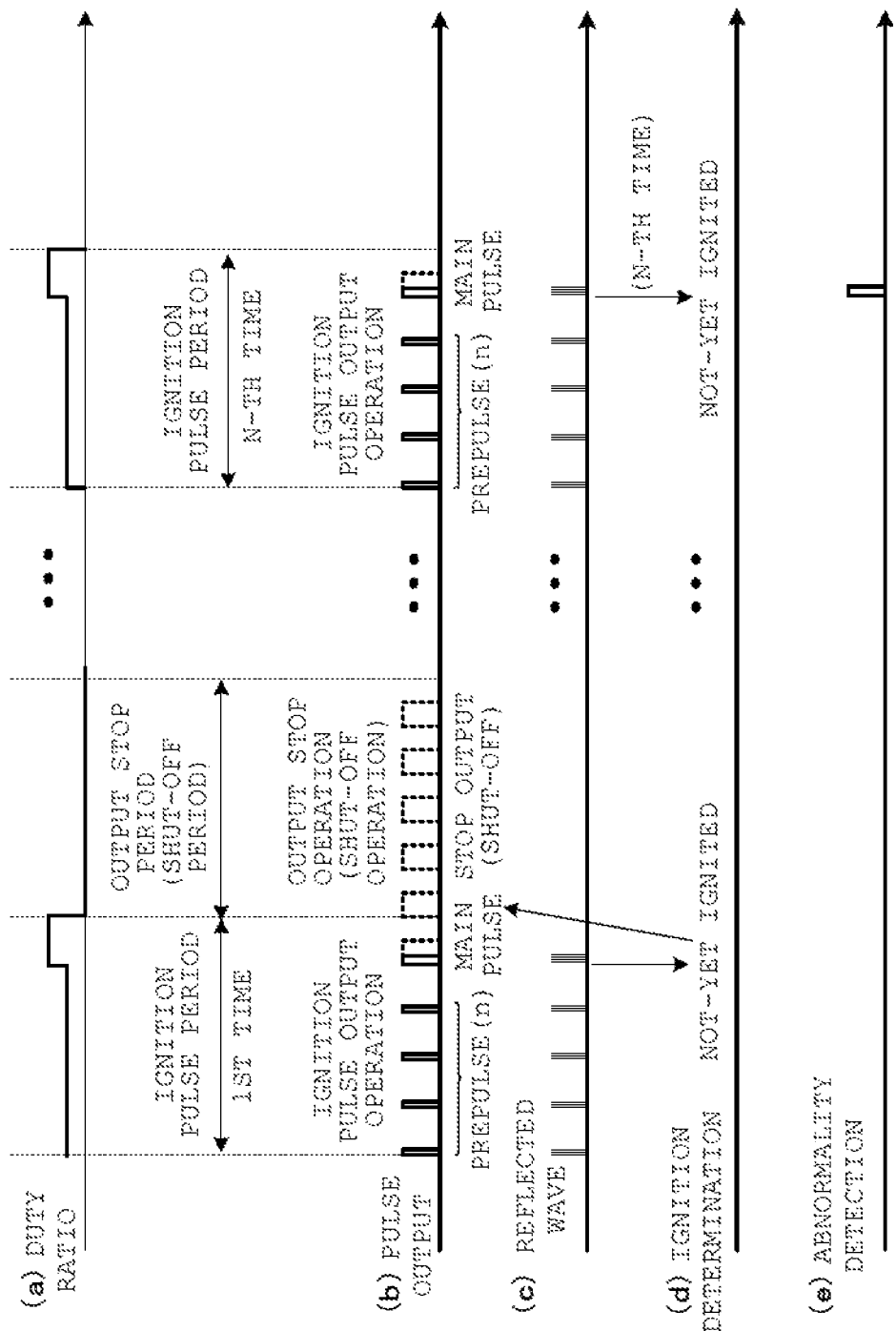
FIG. 10 is a signal diagram illustrating the first operation example of plasma ignition according to the high-frequency power supply device of the present invention.
Figure 11:
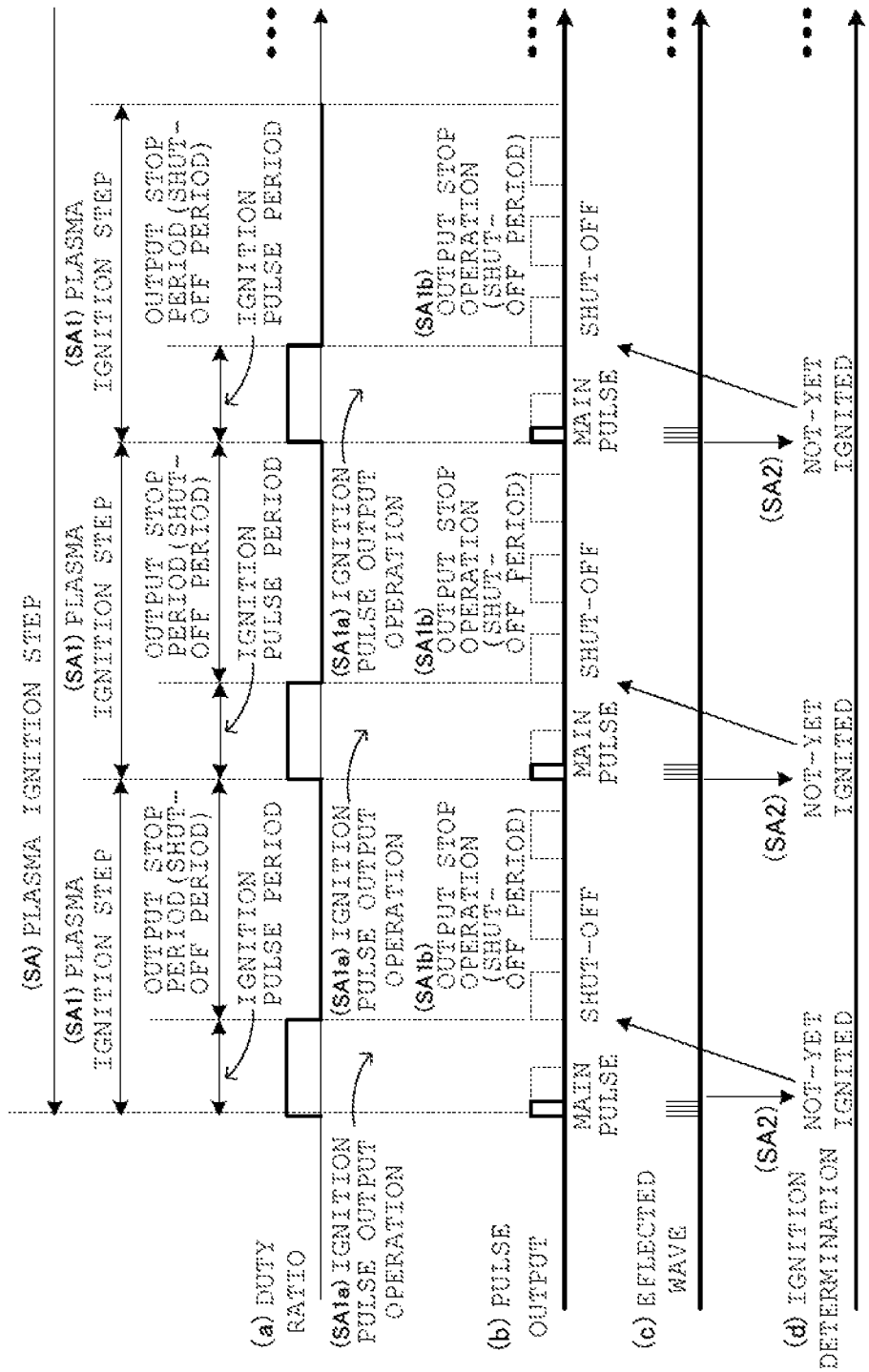
FIG. 11 is a signal diagram illustrating the first operation example of plasma ignition according to the high-frequency power supply device of the present invention.
Figure 12:
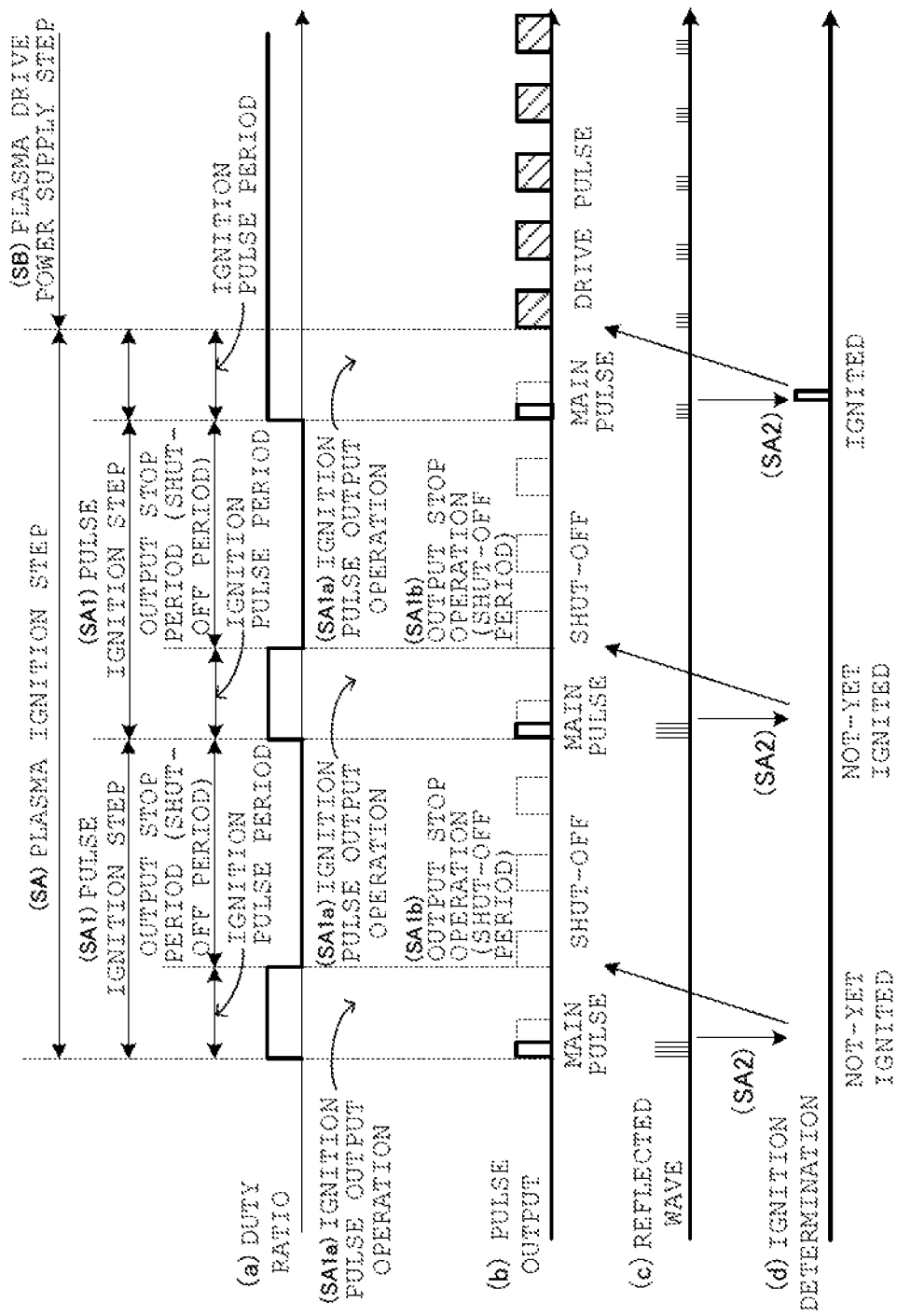
FIG. 12 is a signal diagram illustrating the first operation example of plasma ignition according to the high-frequency power supply device of the present invention.
Figure 13:
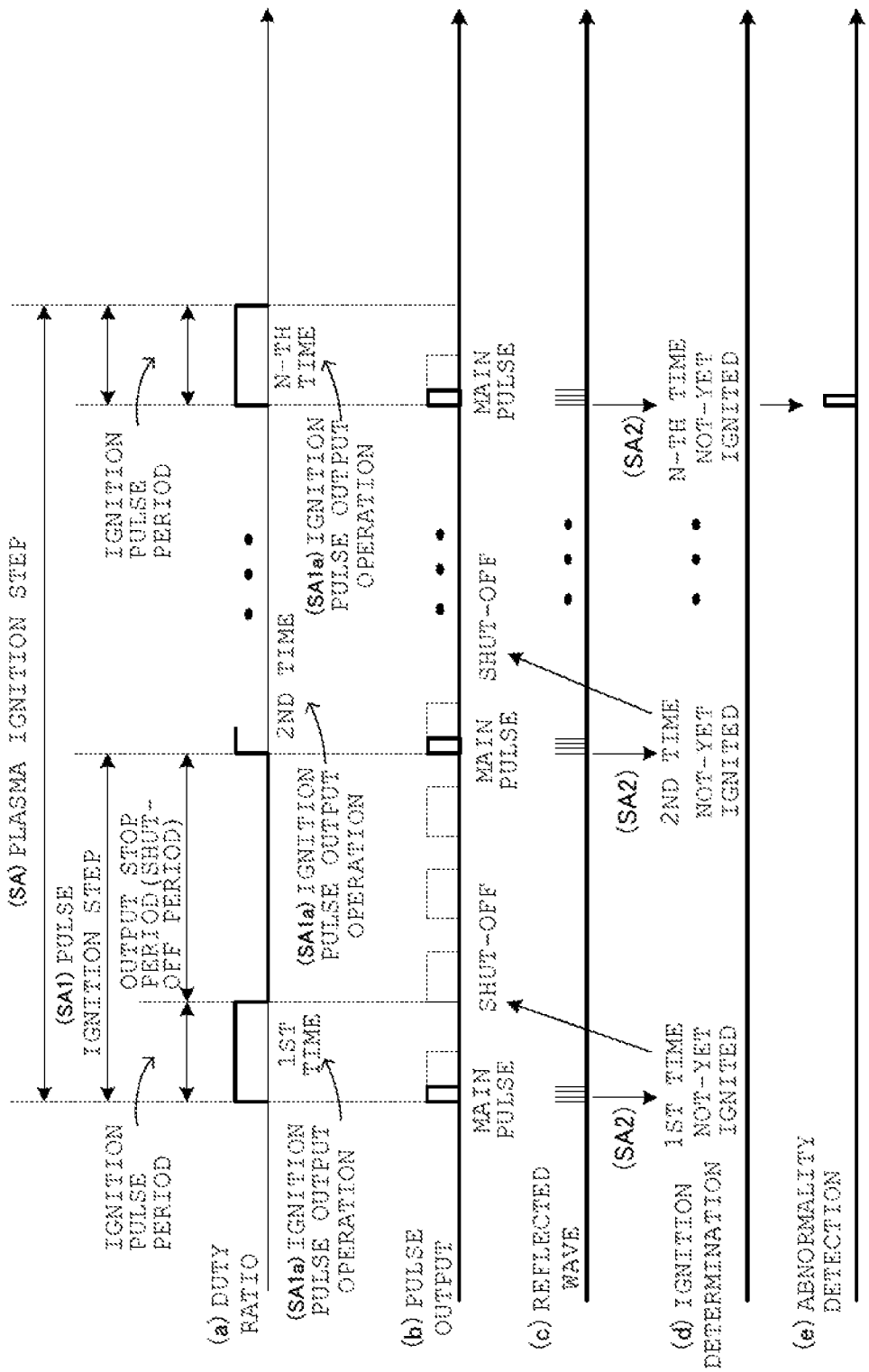
FIG. 13 is a signal diagram illustrating the first operation example of plasma ignition according to the high-frequency power supply device of the present invention.
Figure 14:
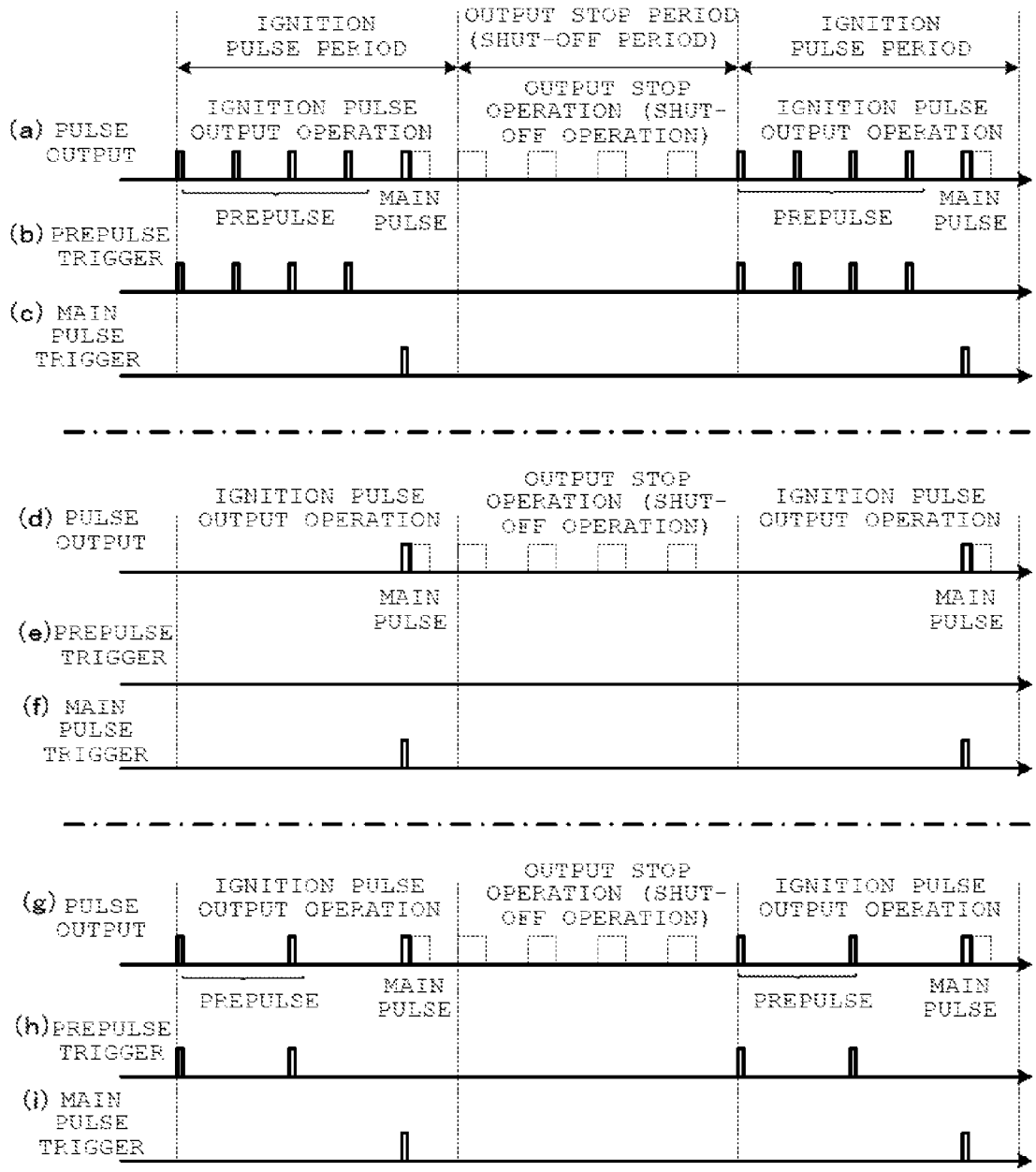
FIG. 14 is a signal diagram illustrating the first operation example of plasma ignition according to the high-frequency power supply device of the present invention.
Figure 15:
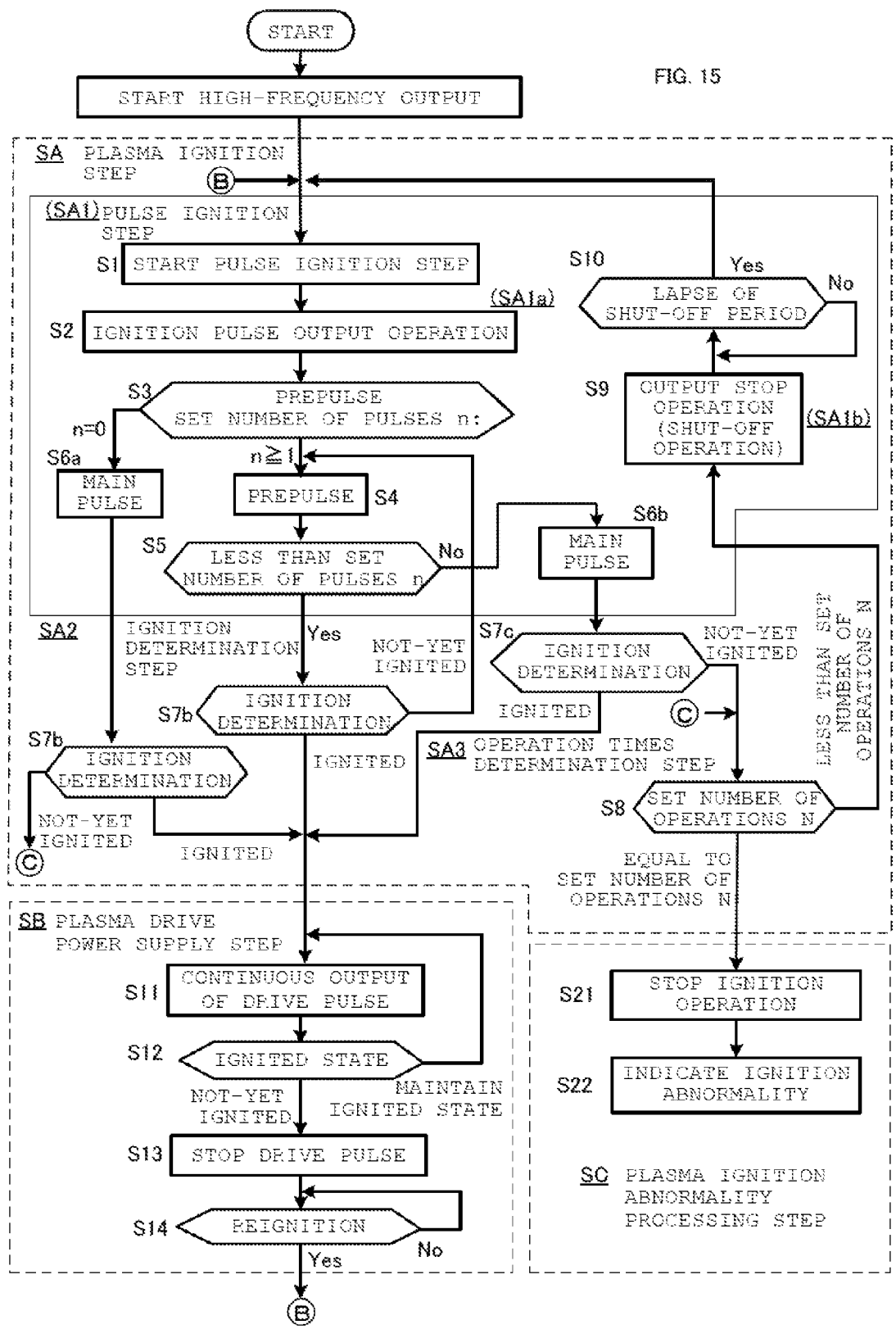
FIG. 15 is a flowchart illustrating a second operation example of plasma ignition according to the high-frequency power supply device of the present invention.

In the first operation example, plasma ignition is determined by a reflected wave of a main pulse. With reference to a flowchart of FIG. 6, a block diagram of FIG. 7, and signal diagrams of FIGS. 8 to 14, the first operation example of the high-frequency power supply device will be described. FIG. 7 is the block diagram for describing a configuration example of forming a prepulse and a main pulse, FIGS. 8 to 10 are signal diagrams for describing the case where n prepulses are outputted, and FIGS. 11 to 13 are signal diagrams for describing the case where no prepulse is outputted. FIG. 14 is a signal diagram for describing an operation for outputting a prepulse.

In the flowchart of FIG. 6, after the high-frequency (RF) output is started, the plasma ignition step (SA) performs the plasma ignition operation, and after the plasma is ignited, thus generated plasma is maintained by the plasma drive power supplying step (SB). In the case where the plasma ignition fails after the pulse ignition operation repeated by the set number of times, the plasma ignition abnormality processing step (SC) is performed.

In the plasma ignition step (SA), the pulse ignition step is started (S1), and then the ignition pulse output operation (SA1a) is started (S2). In the ignition pulse signal operation, a predetermined number of prepulses and one main pulse are outputted in the ignition pulse period having a predetermined duration of time. A pulse output of the ignition pulse is formed by turning on and off a high-frequency output having a predetermined duty ratio. The duty ratio of the pulse output of the prepulse is configured in such a manner that average reflected wave power per ignition pulse period of total reflected wave power generated by the pulse output of the set number of pulses is within the range of average allowable loss per ignition pulse period or less than the average allowable loss of the power elements that form the high-frequency power supply device. As for the duty ratio of the pulse output of the main pulse is also configured in such a manner that average reflected wave power per ignition pulse period of total reflected wave power generated by the pulse output of the main pulses is within the range of average allowable loss or less than the average allowable loss per ignition pulse period, of the power elements that form the high-frequency power supply device. Accordingly, it is possible to prevent damage to the power elements, caused by the reflected wave power.

When "zero" is set as the set number of pulses n for the prepulse (S3), the ignition operation is performed by the main pulse without outputting the prepulse. The duty ratio of the main pulse is not limited to the same ratio as that of the drive pulse in the plasma drive power supplying operation, but it may be any value, as far as it is larger than the duty ratio of the prepulse (S6).

When one or more numbers are set as the set number of pulses n of the prepulse, the prepulses corresponding to this set number are outputted (S4).

The set number of prepulses are outputted, and a main pulse is outputted at the final point of the ignition pulse period (S6), and then, plasma ignition state is determined. Determination of the plasma ignition state according to the ignition determination step (SA2) is made on the basis on the reflected wave voltage, for instance (S7).

In the ignition determination step (SA2), when it is determined that the plasma is ignited, a drive pulse is applied to the load of plasma by the plasma drive power supplying step (SB), and plasma drive power is supplied. On the other hand, when it is determined that plasma has not been ignited yet, the pulse ignition step (SA) is repeated (S8).

In repeating the pulse ignition step (SA), the ignition pulse output operation is repeated for the number of times at the maximum, being the set number of operations N that is predetermined (S8). In the operation times determination step (SA3), when the number of execution times of the ignition pulse output operation reaches the set number of operations N, it is determined as failure of plasma ignition, and a processing for abnormality of plasma ignition (SC) is performed.

When the number of execution times of the ignition pulse output operation is less than the set number of operations N that is predetermined (S8), the output stop operation (shut-off operation) is performed to stop forming the ignition pulse output and drive pulse output, or stop outputting formed pulses (S9), and after a lapse of a predetermined output stop period (shut-off period) (S10), the operations of S1 to S8 are performed again.

In the plasma drive power supplying step (SB), drive pulses are continuously outputted to supply plasma drive power to the plasma load (S11). While the drive pulses are continuously outputted, if the plasma becomes the state not ignited (S12), outputting of drive pulses is stopped (S13). Thereafter, if it is to be reignited (S14), the process returns to the plasma ignition step (SA) to ignite the plasma again.

In the plasma ignition abnormality processing step (SC), the plasma ignition step (SA) is stopped (S21), and indication of ignition abnormality is provided (S22).

FIG. 7 is a block diagram illustrating a configuration example of the pulse output section 20 for forming the ignition pulse of prepulse and main pulse, and the drive pulse. FIG. 7 shows three configuration examples.

Figure 7A:
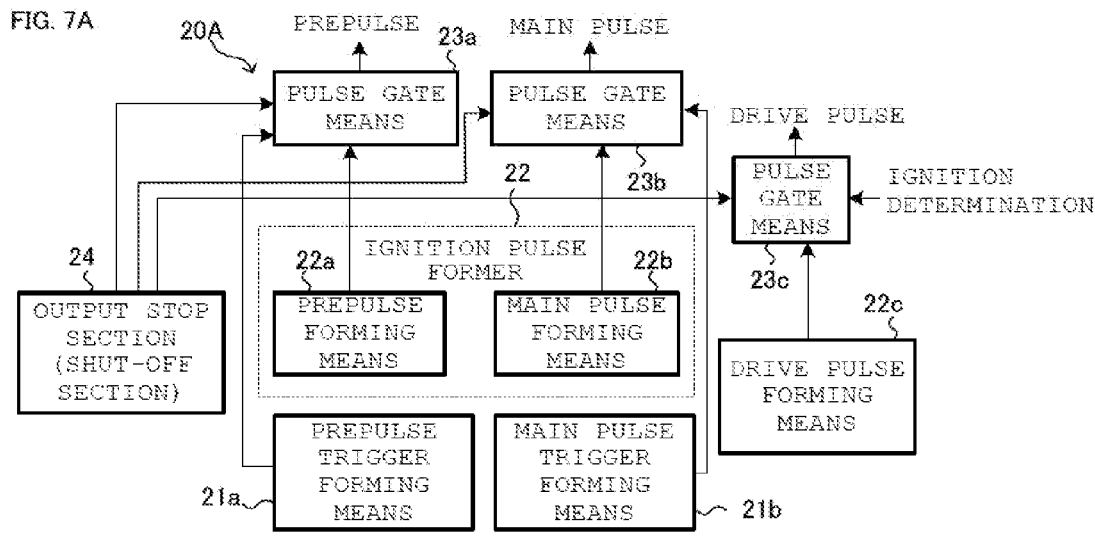
FIG. 7 is a block diagram illustrating the first operation example of plasma ignition according to the high-frequency power supply device of the present invention.

The pulse output section 20A as shown in FIG. 7A has a configuration to output an ignition pulse formed by the ignition pulse former 22, according to a gate signal. The ignition pulse former 22 is provided with a prepulse forming means 22a and a main pulse forming means 22b. A pulse gate means 23a performs output control of a prepulse output formed by the prepulse forming means 22a on the basis of a trigger signal from a prepulse trigger forming means 21a, thereby outputting the prepulse. A pulse gate means 23b performs output control of a main pulse output formed by the main pulse forming means 22b on the basis of a trigger signal from a main pulse trigger forming means 21b, thereby outputting the main pulse. The output stop operation for the prepulse, main pulse, and drive pulse can be performed according to a control signal from the output stop means (shut-off means) 24. A pulse gate means 23c performs output control of a drive pulse output formed by the drive pulse forming means 22c on the basis of a result of determination as to plasma ignition, thereby outputting the drive pulse.

Figure 7B:
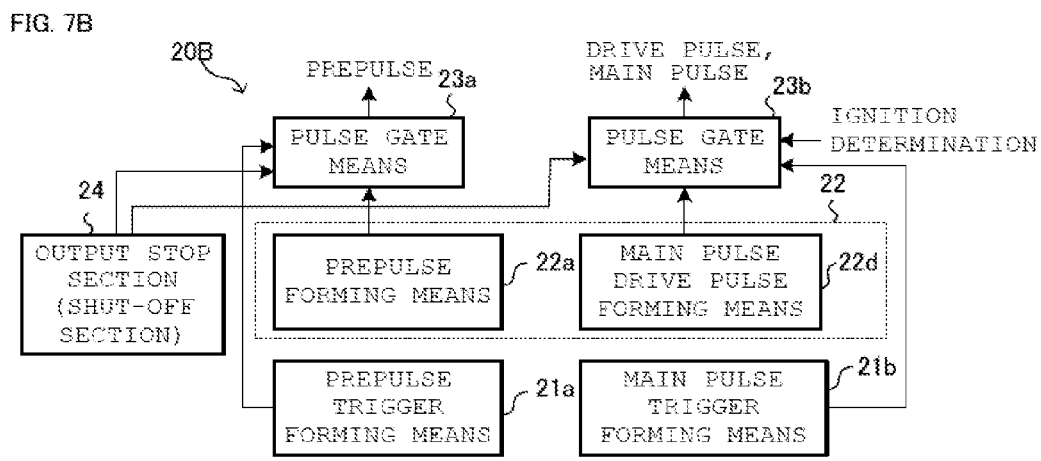

The pulse output section 20B as shown in FIG. 7B has a configuration that the ignition pulse former 22 forms an ignition pulse and a drive pulse. The ignition pulse former 22 is provided with the prepulse forming means 22a and a main pulse and drive pulse forming means 22d. The pulse gate means 23a performs output control of a prepulse output formed by the prepulse forming means 22a on the basis of a trigger signal from the prepulse trigger forming means 21a, thereby outputting the prepulse.

The main pulse and drive pulse forming means 22d forms a main pulse and a drive pulse. A pulse gate means 23b performs output control of the main pulse formed by the main pulse and drive pulse forming means 22d on the basis of a trigger signal from the main pulse trigger forming means 21b, thereby outputting the main pulse. A pulse gate means 23b performs output control of the drive pulse formed by the main pulse and drive pulse forming means 22d on the basis of a result of determination as to plasma ignition, thereby outputting the drive pulse. The output stop operation for the prepulse, main pulse, and drive pulse can be performed, on the basis of a control signal from the output stop means (shut-off means) 24.

Figure 7C:
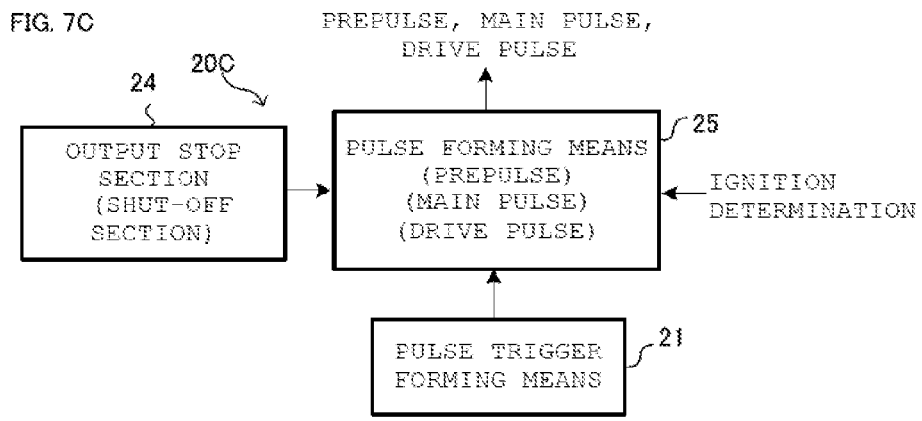

The pulse output section 20C as shown in FIG. 7C has a configuration to form the ignition pulse, main pulse, and drive pulse, according to a pulse forming means 25. The pulse forming means 25 forms a prepulse output, a main pulse output, and a drive pulse output, and controls each of thus formed pulse outputs on the basis of a trigger signal formed by a pulse trigger forming means 21.

The output stop operation for the prepulse, main pulse, and drive pulse is performed on the basis of a control signal from the output stop means (shut-off means) 24, and the drive pulse is outputted by controlling the pulse forming process of the pulse forming means 25 according to a determination as to plasma ignition.

With reference to FIGS. 8 to 10, there will be described the case where n prepulses are outputted. FIG. 8 illustrates the state where the plasma is not yet ignited, FIG. 9 illustrates the state where the plasma is ignited, and FIG. 10 illustrates the state where abnormality is detected.

FIG. 8 illustrates an operation example in the case where the plasma has not been ignited yet, as a result of performing the ignition pulse output operation. FIG. 8(a) indicates a duty ratio of pulse output, FIG. 8(b) indicates a pulse output, FIG. 8(c) indicates a reflected wave, and FIG. 8(d) indicates determination of ignition.

FIG. 8 illustrates an example that the ignition pulse includes plural prepulses and one main pulse. The duty ratio of the plural prepulses constituting the ignition pulse is set in such a manner that average reflected wave power per ignition pulse period of total reflected wave power generated by the pulse output corresponding to the set number of pulses outputted in the ignition pulse period, is within the range of an average allowable loss or less than the average allowable loss per ignition pulse period, of the power elements that form the high-frequency RF power supply device.

The duty ratio of the pulse output of the main pulse that is delivered after the prepulses, is set to be larger than the duty ratio of the pulse output of the prepulse. For example, it may be approximately the same as the duty ratio of drive pulse. The duty ratio of the pulse output of the main pulse is set in such a manner that average reflected wave power per ignition pulse period of total reflected wave power generated by the pulse output is in the range of the average allowable loss or less than the average allowable loss per ignition pulse period, of the power elements that form the high-frequency power supply device.

It is further possible to set the duty ratio of the prepulse and the main pulse, in such a manner that the average reflected wave power per ignition pulse period of total reflected wave power generated by the pulse output of both the prepulse and the main pulse is in the range of the average allowable loss or less than the average allowable loss per ignition pulse period, of the power elements that form the high-frequency power supply device.

As for the pulse output delivered in the ignition pulse period, the ignition state is determined on the basis of the reflected wave (FIG. 8(c)) according to the pulse output in the ignition pulse period (FIG. 8(d)). In the case where it is determined that the plasma has not been ignited yet, the ignition pulse period is put to an end, and it is shifted to the output stop operation (shut-off operation), then stopping delivery of the pulse output of the ignition pulse and the drive pulse. After a lapse of the output stop period (shut-off period), the plasma ignition operation is restarted in the subsequent ignition pulse period.

FIG. 9 illustrates an operation example that the ignition pulse output operation brings about the ignited state. FIG. 9(a) indicates a duty ratio of the pulse output, FIG. 9(b) indicates the pulse output, FIG. 9(c) indicates a reflected wave, and FIG. 9(d) indicates determination of ignition.

As for the pulse output delivered in the ignition pulse period, the ignition state is determined on the basis of the reflected wave (FIG. 9(c)) according to the pulse output in the ignition pulse period (FIG. 9(d)). In the case where it is determined that the plasma is ignited, the ignition pulse output operation is put to an end, and it is shifted to the plasma drive power supplying step, then supplying drive power to the plasma load.

FIG. 10 illustrates an operation example that the ignition pulse output operation is performed N times, and as a result of outputting the N-th main pulse, the prepulse still has not been ignited yet. FIG. 10(a) indicates a duty ratio of the pulse output, FIG. 10(b) indicates the pulse output, FIG. 10(c) indicates a reflected wave, FIG. 10(d) indicates determination of ignition, and FIG. 10(e) indicates an abnormality detection signal.

The ignition pulse output operation and the output stop operation are repeated. When it is determined in the N-th ignition pulse output operation, the set number of operations corresponding to N, the plasma has not been ignited yet by the reflected wave according to the main pulse, it is determined that there is some sort of abnormality in the plasma generation, and an abnormality detection signal is outputted.

FIGS. 8 to 10 illustrate an example that the ignition pulse includes prepulses and one main pulse, whereas FIGS. 11 to 13 illustrate an example that one main pulse constitutes the ignition pulse.

FIG. 11 illustrates that the plasma has not been ignited yet, FIG. 12 illustrates the plasma is ignited, and FIG. 13 illustrates the state that abnormality is detected.

FIG. 11(a) indicates a duty ratio of the pulse output, FIG. 11(b) indicates the pulse output, FIG. 11(c) indicates a reflected wave, and FIG. 11(d) indicates determination of ignition.

The ignition pulse includes one main pulse in the ignition pulse period, and for example, the duty ratio may be approximately the same as the duty ratio of the drive pulse.

As a result of the ignition operation according to the ignition pulse of one main pulse, when it is determined that the plasma has not been ignited yet, another main pulse is outputted again after a lapse of the output stop period (shut-off period), similar to the example of FIG. 8. The output stop period (shut-off period) may be any duration of time, and it may be equal to the ignition pulse period, or longer than the ignition pulse period.

FIG. 12 illustrates an operation example for the case that the plasma becomes ignited, as a result of the ignition pulse output operation. FIG. 12(a) indicates a duty ratio of the pulse output, FIG. 12(b) indicates the pulse output, FIG. 12(c) indicates a reflected wave, FIG. 12(d) indicates determination of ignition.

As for the ignition pulse delivered in the ignition pulse period, the ignition state is determined on the basis of the reflected wave (FIG. 12(c)) according to the pulse in the ignition pulse period (FIG. 12(d)). In the case where it is determined that the plasma is ignited, the ignition pulse output operation is put to an end, and it is shifted to the plasma drive power supplying step, then supplying drive power to the plasma load.

FIG. 13 illustrates an operation example that the ignition pulse output operation is performed N times, and as a result of outputting the N-th main pulse, the prepulse still has not been ignited yet. FIG. 13(a) indicates a duty ratio of the pulse output, FIG. 13(b) indicates the pulse output, FIG. 13(c) indicates a reflected wave, FIG. 13(d) indicates determination of ignition, and FIG. 13(e) indicates an abnormality detection signal.

The ignition pulse output operation and the signal stop operation are repeated. When it is determined in the N-th ignition pulse output operation, the set number of operations corresponding to N, that the plasma has not been ignited yet by the reflected wave according to the main pulse, it is determined that there is some sort of abnormality in the plasma generation, and an abnormality detection signal is outputted.

FIG. 14 illustrates an operation example for outputting a prepulse. FIG. 14(a) to FIG. 14(c) illustrate the case where plural prepulses are outputted, FIG. 14(d) to FIG. 14(f) illustrate the case where no prepulse is outputted, and FIG. 14(g) to FIG. 14(i) illustrate an optional pulse interval is set between the prepulses.

In the operation examples as shown in FIG. 14(a) to FIG. 14(c), during the ignition pulse period, each of the prepulses is formed and outputted on the basis of a prepulse trigger (FIG. 14(b)), and a main pulse is formed and outputted on the basis of a main pulse trigger (FIG. 14(c)). On the other hand, during the output stop period, the prepulse trigger and the main pulse trigger are not outputted, thereby stopping delivery of the prepulse and the main pulse. In the output stop period, outputting a drive pulse is also stopped. FIG. 14(a) indicates each pulse in the output stop state by a broken line.

In the operation examples shown in FIG. 14(d) to FIG. 14(f), during the ignition pulse period, a prepulse is not outputted by stopping delivery of the prepulse trigger (FIG. 14(e)), and a main pulse is formed and outputted on the basis of the main pulse trigger (FIG. 14(f)). On the other hand, during the output stop period, neither the prepulse trigger nor the main pulse trigger are delivered, and outputting the prepulse and the main pulse is stopped. In the output stop period, outputting a drive pulse is also stopped. FIG. 14(d) indicates each pulse in the output stop state by a broken line.

In the operation examples as shown in FIG. 14(g) to FIG. 14(i), during the ignition pulse period, a prepulse trigger (FIG. 14(h)) is set arbitrarily, thereby outputting prepulses at any cycles or at any time intervals, and a main pulse is formed and outputted on the basis of the main pulse trigger (FIG. 14(i)). On the other hand, during the output stop period, neither the prepulse trigger nor the main pulse trigger are outputted, thereby stopping the output of the prepulse and the main pulse. In the output stop period, outputting of a drive pulse is also stopped. FIG. 14(g) indicates each pulse in the output stop state by a broken line.

[Second Operation Example of Ignition Operation of High-Frequency Power Supply Device]

Figure 16:
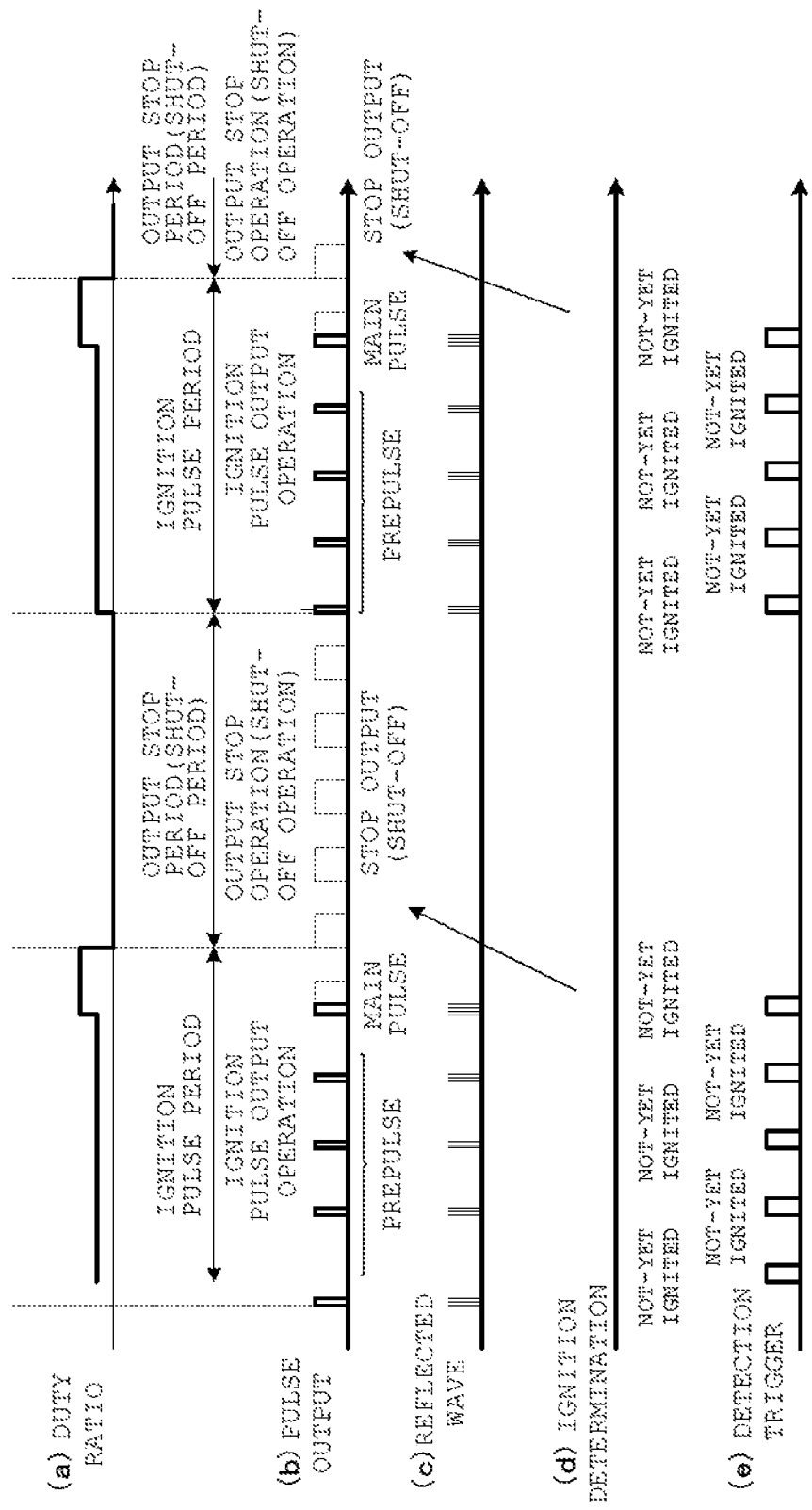
FIG. 16 is a signal diagram illustrating the second operation example of plasma ignition according to the high-frequency power supply device of the present invention.

In the second operation example, determination of plasma ignition is performed both when the main pulse is outputted and when the prepulse is outputted during the ignition pulse period. With reference to the flowchart of FIG. 15, and the signal diagrams of FIGS. 16 to 18, the second operation example of the ignition operation of the high-frequency power supply device will be described. FIGS. 16 to 18 illustrate the cases where the ignition pulse includes plural prepulses. The second operation example shows that the plasma ignition state is determined on the basis of a determination trigger.

After the high-frequency output is started, the plasma ignition step (SA) performs the plasma ignition operation. After the plasma is ignited, the plasma drive power supplying step (SB) maintains plasma thus generated, whereas if the plasma fails to be ignited after performing the set number of plasma ignition operations, a processing for the abnormality of plasma ignition (SC) is performed.

In the plasma ignition step (SA), subsequent to starting the plasma ignition operation (S1), outputting the ignition pulse is started (S2).

In a predetermined duration of the ignition pulse period, outputs of a predetermined number of prepulses and one main pulse are delivered as the ignition pulse (S3). The pulse output is formed by turning on and off the high-frequency output at a predetermined duty ratio. Prepulses are delivered as the pulse output within the ignition pulse period, and the number of the prepulses is predetermined. The duty ratio of the pulse output is set in such a manner that average reflected wave power per ignition pulse period of total reflected wave power generated by the pulse output of the set number of pulses is in the range of the average allowable loss or less than the average allowable loss per ignition pulse period, of power elements that form the high-frequency power supply device.

The duty ratio of the pulse output of the main pulse is set in such a manner that the average reflected wave power per ignition pulse period of total reflected wave power generated by the pulse output is in the range of the average allowable loss or less than the average allowable loss per ignition pulse period, of the power elements that form the high-frequency power supply device.

The duty ratio of the pulse output of the prepulse and the main pulse may also be set in such a manner that the average reflected wave power per ignition pulse period of total reflected wave power generated by the pulse output of both the prepulse and the main pulse is in the range of the average allowable loss or less than the average allowable loss per ignition pulse period, of the power elements that form the high-frequency power supply device.

When the set number of pulses n of the prepulse is "zero", a main pulse is outputted (S3, S6a) and the plasma ignition state is determined (S7a). When the plasma is determined as being ignited, the processing is shifted to the plasma drive power supplying step (SB). When it is determined that the plasma has not been ignited yet, outputting of the ignition pulse and drive pulse is stopped according to the output stop operation (S9), and after a lapse of the output stop period, the process returns to the pulse ignition step (S1), until the number of execution times of the ignition pulse step becomes the set number of operations N (S8).

If the set number of pulses n of the prepulse is "one or more", a prepulse is outputted (S4). When the number of prepulse outputting times is less than the set number of pulses n (S5), the plasma ignition is determined by the reflected wave of each prepulse. The plasma ignition is determined on the basis of the reflected wave voltage, for instance (S7b). If it is determined that the plasma is ignited, the process is shifted to the plasma drive power supplying step (SB). If it is determined that the plasma has not been ignited yet, remaining prepulses are outputted (S4).

In determining the ignition state according to the prepulse (S5), when the number of outputting times of prepulse reaches the set number of pulses n (S5), a main pulse is outputted (S6b), and ignition of plasma is determined by the reflected wave according to the main pulse (S7c). When it is determined that the plasma is ignited, the process is shifted to the plasma drive power supplying step (SB). When it is determined that the plasma has not been ignited yet, outputting of the ignition pulses and the drive pulses is stopped (S9) and after a lapse of the output stop period, the process returns to the pulse ignition step (S1), and the operation for igniting the plasma is performed again, until the number of execution times of the ignition pulse step becomes the set number of operations N (S8).

The plasma ignition operation is repeated for the set number of operations N being predetermined (S8), and in the case where the number of execution times reaches the set number of operations N and it is determined that the plasma fails to be ignited, a processing for abnormality of the plasma ignition (SC) is performed.

In the plasma drive power supplying step (SB), drive pulses are continuously outputted, thereby supplying plasma drive power to the plasma (S11). If the plasma comes into the state of not yet ignited (S12) while the drive pulses are continuously outputted, outputting of drive pulses is stopped (S13). Thereafter, for performing the ignition again (S14), the process returns to the pulse ignition step (S1), and ignition of plasma is tried again.

In the processing for the abnormality of plasma ignition (SC), the plasma ignition step (SA) is stopped (S21), and indication of ignition abnormality is provided (S22).

With reference to FIGS. 16 to 18, the case where n prepulses are outputted will now be described. FIG. 16 illustrates that the plasma has not been ignited yet, FIG. 17 illustrates that the plasma is ignited, and FIG. 18 illustrates the state where abnormality is detected.

FIG. 16 illustrates an operation example where the state has not been ignited yet, as a result of the ignition operation. FIG. 16(a) indicates a duty ratio of the pulse output, FIG. 16(b) indicates the pulse output, FIG. 16(c) indicates a reflected wave, FIG. 16(d) indicates determination of ignition, and FIG. 16(e) indicates a determination trigger to determine ignition.

As for the pulse output delivered during the ignition pulse period, a determination trigger is outputted (FIG. 16(e)) at each point of delivering the pulse output of prepulse and main pulse, and the ignition state is determined on the basis of the reflected wave at each point (FIG. 16(c)) (FIG. 16(d)). When it is determined that the plasma has not been ignited yet, the ignition pulse output operation is put to an end, and the process is shifted to the output stop operation (shut-off operation), so as to stop delivering of the pulse output. After a lapse of the output stop period (shut-off period), the plasma ignition operation is restarted in the subsequent ignition pulse period.

FIG. 17 illustrates an operation example in the case where the ignition operation brings about the ignited state. FIG. 17(a) indicates a duty ratio of pulse output, FIG. 17(b) indicates the pulse output, FIG. 17(c) indicates a reflected wave, FIG. 17(d) indicates determination of ignition, and FIG. 17(e) indicates a determination trigger for determining the ignition.

As for the pulse output delivered during the ignition pulse period, a determination trigger is outputted at a point when each pulse output is delivered (FIG. 17(e)), and the ignition state is determined on the basis of the reflected wave at each point (FIG. 17(c)) (FIG. 17(d)). When it is determined that the plasma is ignited, the ignition pulse period is put to an end, and the process is shifted to the operation for supplying plasma drive power, so as to supply drive power to the plasma load.

FIG. 18 illustrates an operation example where the ignition pulse output operation is performed N times, and the plasma still has not been ignited yet, when the N-th main pulse is outputted. FIG. 18(a) indicates a duty ratio of the pulse output, FIG. 18(b) indicates the pulse output, FIG. 18(c) indicates a reflected wave, FIG. 18(d) indicates determination of ignition, FIG. 18(e) indicates a determination trigger for determining the ignition, and FIG. 18(f) indicates an abnormality detection signal.

The ignition pulse output operation and the signal stop operation are repeated, and in the N-th time ignition pulse output operation, the set number of operations corresponding to N, if the plasma has not been ignited yet when the main pulse is outputted, it is determined that there is some sort of abnormality in plasma generation, and an abnormality detection signal is outputted.

FIG. 19 illustrates an example where the duty ratio of the pulse output is increased gradually, for the ignition pulse in each ignition pulse period. FIG. 19 shows that the duty ratio of the pulse output is gradually increased in the example that is shown in FIG. 8.

Also in this case where the duty ratio is increased gradually, the duty ratio of the pulse output of the prepulse may be set in such a manner that average reflected wave power per ignition pulse period of total reflected wave power generated by the pulse output of set number of pulses is in the range of average allowable loss or less than the average allowable loss per ignition pulse period, of the power elements that form the high-frequency power supply device. The duty ratio of the pulse output of the main pulse outputted at the final point of the ignition pulse period is set larger than the duty ratio of the prepulse. The duty ratio of the main pulse may be configured as equal to the duty ratio of the drive pulse that is outputted during the period for supplying plasma drive power. By gradually increasing the duty ratio of the pulse output of the prepulse in the ignition pulse period, this may lead to facilitating ignition.

[Outline Configuration for Determining Plasma Ignition According to the Present Invention]

Figure 20:
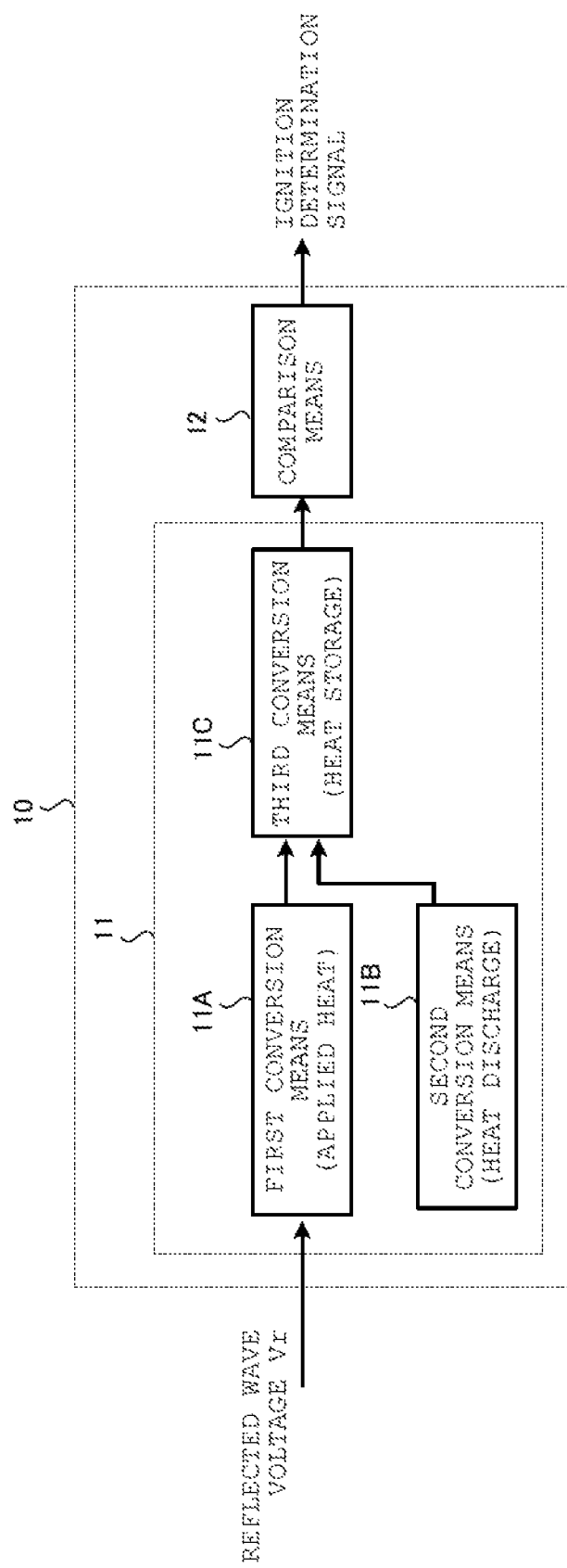
FIG. 20 illustrates an outline configuration for determining the ignition state according to the present invention.

With reference to FIGS. 20 to 22, an outline configuration as to determination of plasma ignition according to the present invention will be described, and a process flow will be schematically described with reference to a flowchart of FIG. 23.

In determining the plasma ignition according to the present invention, it is determined whether the plasma load is ignited or not yet ignited on the basis of the occurrence of the reflected wave that is obtained from the reflected wave voltage $V_r$ that flows from the plasma load to the high-frequency power source.

FIG. 20 illustrates an outline configuration to determine that the plasma has not been ignited yet, according to the present invention. The ignition determiner 10 is provided with a conversion means 11 that obtains a converted quantity equivalent to a heat quantity applied to RF power amplifier elements of the high-frequency power source, on the basis of a peak value and fluctuations of the reflected wave voltage $V_r$, and a comparison means 12 that compares the equivalent quantity obtained by the conversion means 11 with a threshold corresponding to an allowable heat quantity of the RF power amplifier elements.

The conversion means 11 is provided with a first conversion means 11A, a second conversion means 11B, and a third conversion means 11C.

Figure 23:
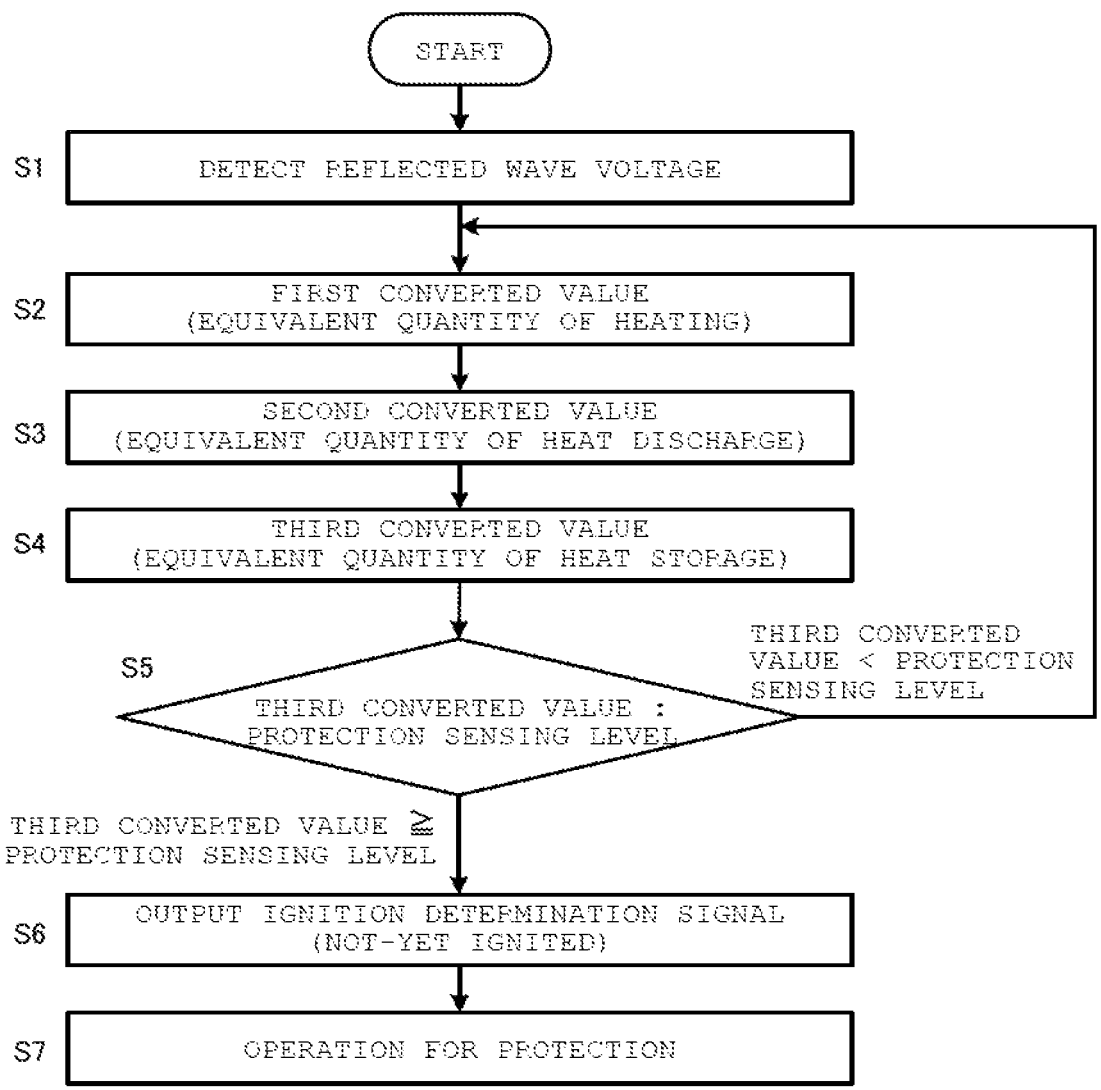
FIG. 23 is a flowchart illustrating a schematic process for determining the ignition state according to the present invention.
Figure 24:
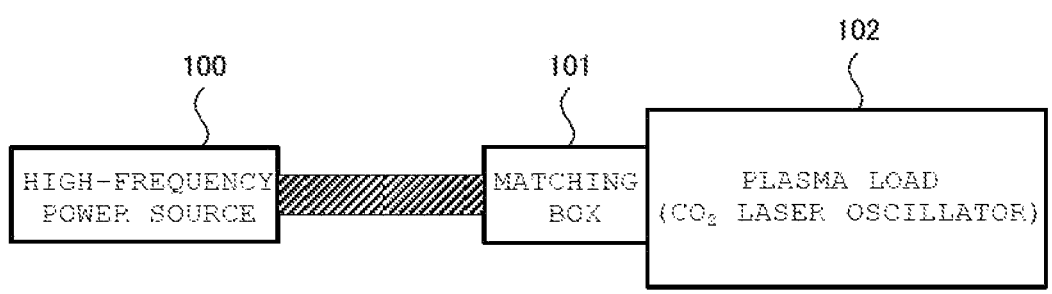
FIG. 24 schematically illustrates driving of a plasma load according to a high-frequency (RF) power source.

The first conversion means 11A inputs reflected wave voltage $V_r$ (S1 in FIG. 23) detected by a power sensor, and on the basis of the reflected wave voltage $V_r$ and duration of time of the reflected wave voltage $V_r$, a first converted value (equivalent value of applied heat) is obtained, which corresponds to a heat quantity added to the RF power amplifier elements of the high-frequency power source (S2 in FIG. 23).

The second conversion means 11B obtains a second converted value equivalent to heat discharge that is released from the RF power amplifier elements of the high-frequency power source, in every cycle of pulse drive, on the basis of the elapsed time from when the peak value of the reflected wave voltage $V_r$ becomes zero, or the elapsed time from starting application of the pulse output.

In the mode where the second converted value is obtained on the basis of the elapsed time from when the peak value of the reflected wave voltage $V_r$ becomes zero, the conversion is performed, assuming that most of the heat discharge from the RF power amplifier elements is obtained from the state where application of the reflected wave to the RF power amplifier elements is stopped, and the amount of heat discharge is very small during the period when the reflected wave is being applied to the RF power amplifier elements.

On the other hand, in the mode where the second converted value is obtained on the basis of the elapsed time from starting application of the pulse output, the conversion is performed, using the amount of the heat discharge during the period when the reflected wave is being applied to the RF power amplifier elements (S3 in FIG. 23).

The third conversion means 11C obtains a third converted value (equivalent quantity of heat storage), on the basis of a difference between the first converted value and the second converted value, the third converted value corresponding to a quantity of heat storage accumulated in the RF power amplifier elements of the high-frequency power source (S4 in FIG. 23).

The comparison means 12 compares the third converted value obtained by the third conversion means 11C, with the threshold corresponding to the allowable heat quantity of the RF power amplifier elements. The threshold corresponds to a device protection sensing level for protecting the RF power amplifier elements, and when the third converted value exceeds the threshold, it is determined that a heat quantity accumulated in the RF power amplifier elements exceeds the device protection sensing level of the RF power amplifier elements (S5 in FIG. 23), and the plasma is determined as not yet ignited (S6 in FIG. 23).

When it is determined that the plasma has not been ignited yet, the power controller controls the high frequency output (RF output) to droop or stop, to perform a protecting operation (S7 in FIG. 23).

In one cycle of the pulse drive, it is possible to describe the power supply from the high-frequency power source according to pulse drive, as being in any of the following two modes; a low-frequency pulse mode and a high-frequency pulse mode, on the basis of whether or not a quantity of heat storage still remains at the end of the cycle, as a result of discharging heat that has been applied.

In the low-frequency pulse mode, intervals of pulse drive cycle have sufficiently long duration of time for discharging a quantity of heat being applied, and no heat storage remains at the end of the pulse drive cycle, and the equivalent quantity of heat storage is zero. The equivalent quantity of heat storage that is converted in the low-frequency pulse mode starts accumulation from the initial value being zero, in every cycle of the pulse drive.

On the other hand, in the high-frequency pulse mode, intervals of pulse drive cycle do not have sufficiently long duration of time for discharging the quantity of heat being applied, and a quantity of heat storage remains at the end of the pulse drive cycle, and there is residual equivalent quantity of heat storage. The equivalent quantity of heat storage that is converted in the high-frequency pulse mode starts accumulation from an initial value corresponding to the equivalent value of heat storage at the end of previous cycle in every pulse drive cycle.

Under the condition of the pulse drive having an equal duty ratio of the pulse output and an equal peak value of reflected wave, when the length of one cycle T of the pulse drive is long and a quantity of heat storage remaining at the end of one cycle is zero, the mode becomes the low-frequency pulse mode, whereas when the length of one cycle T of the pulse drive is short and there is a residual quantity of heat storage at the end of one cycle, the mode becomes the high-frequency pulse mode.

The low frequency mode and the high frequency mode in the ignited state will be described with reference to the signal diagram of FIG. 21, and the low frequency mode and the high frequency mode in the state not yet ignited will be described with reference to the signal diagram of FIG. 22.

When the plasma is ignited, FIGS. 21A to 21D indicate, respectively, traveling wave voltage $V_f$, reflected wave voltage $V_r$, an equivalent quantity of heat storage $H_{ac}$, and an ignition determination signal $V_{fail}$ in the low-frequency pulse mode, and FIGS. 21E to 21H indicate, respectively, the traveling wave voltage $V_f$, the reflected wave voltage $V_r$, the equivalent quantity of heat storage $H_{ac}$, and the ignition determination signal $V_{fail}$ in the high-frequency pulse mode.

In those examples here, the ignition determination signal $V_{fail}$ is outputted when it is determined that the plasma has not been ignited yet.

The forward wave voltage $V_f$ delivers the pulse output within one cycle, at a predetermined frequency in the $RF_{on}$ interval having duration of time $t_1$ (FIGS. 21A and 21E). If the plasma is ignited normally, a mismatch at a rise and a fall of the pulse output may cause pulse-like reflected wave voltage $V_r$ (FIGS. 21B and 21F).

In FIGS. 21C and 21G, the equivalent quantity of heat storage $H_{ac}$ indicates a converted value of heat that is accumulated when the reflected wave voltage $V_r$ is applied to the RF power amplifier elements, and the dashed-dotted line indicates an allowable amount against thermal failure in the RF power amplifier elements, representing a device protection sensing level for protecting the RF power amplifier elements against failure due to the reflected wave.

In the case where the plasma is in the state of ignited, in any of the low frequency mode and the high frequency mode, the equivalent quantity of heat storage $H_{ac}$ returns to zero without reaching the device protection sensing level in every cycle of the drive mode, and therefore, no ignition determination signal $V_{fail}$ is outputted (FIGS. 21D and 21H), and it is not determined as not-yet ignited.

On the other hand, when the plasma has not been ignited yet, FIGS. 22A to 22D indicate, respectively, the forward wave voltage $V_f$, the reflected wave voltage $V_r$, the equivalent quantity of heat storage $H_{ac}$, and the ignition determination signal $V_{fail}$ in the low-frequency pulse mode, and FIGS. 22E to 22H indicate, respectively, the forward wave voltage $V_f$, the reflected wave voltage $V_r$, the equivalent quantity of heat storage $H_{ac}$, and the ignition determination signal $V_{fail}$ in the high-frequency pulse mode. In those examples here, it is determined whether the plasma is ignited or not according to a determination trigger.

Figure 22A:
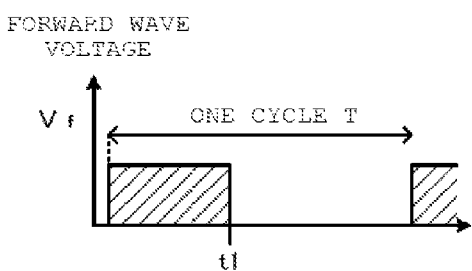
FIG. 22 is a signal diagram illustrating the low frequency mode and the high frequency mode in the state not yet ignited.
Figure 22E:
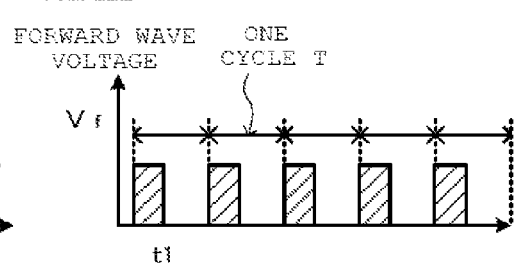
Figure 22B:
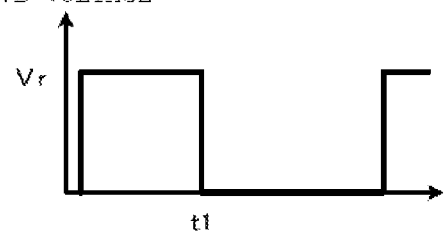
Figure 22F:
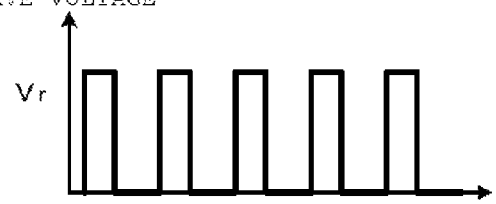

The forward wave voltage $V_f$ delivers the pulse output within one cycle, at a predetermined frequency in the $RF_{on}$ interval having duration of time $t_1$ (FIGS. 22A and 22E). If the plasma has not been ignited yet, a rectangular-like reflected wave voltage $V_r$ is generated in the $RF_{on}$ interval where the pulse output is delivered (FIGS. 22B and 22F).

Figure 22C:
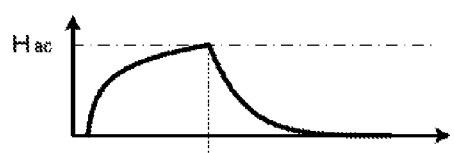
Figure 22G:
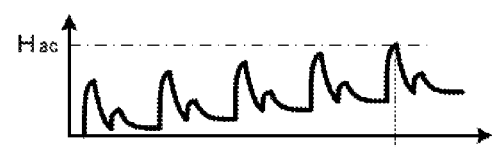

In FIGS. 22C and 22G, the equivalent quantity of heat storage $H_{ac}$ indicates a converted value of heat that is accumulated when the reflected wave voltage $V_r$ is applied to the RF power amplifier elements, and the dashed-dotted line indicates an allowable amount against thermal failure of the RF power amplifier elements, representing a device protection sensing level for protecting the RF power amplifier elements against failure due to the reflected wave.

Figure 22D:

When the plasma has not been ignited yet, in the low frequency mode, the equivalent quantity of heat storage $H_{ac}$ reaches the device protection sensing level within a cycle of the drive mode (FIG. 22C), and therefore, an ignition determination signal $V_{fail}$ is outputted (FIG. 22D). FIG. 22C shows the case where the equivalent quantity of heat storage $H_{ac}$ reaches the device protection sensing level at the end of the $RF_{on}$ interval. However, if the peak value of the reflected wave voltage $V_r$ is large, the equivalent quantity of heat storage $H_{ac}$ reaches the device protection detection level at a point before the end of the $RF_{on}$ interval, and the ignition determination signal $V_{fail}$ is outputted. Outputting of the ignition determination signal $V_{fail}$ indicates that the plasma has not been ignited yet.

Figure 22H:
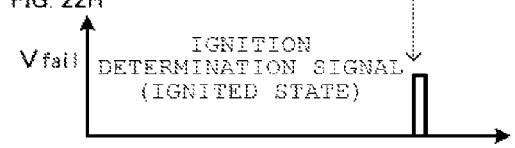

In the high frequency mode, storing of heat is repeated in plural cycles, and the equivalent quantity of heat storage $H_{ac}$ reaches the device protection sensing level accordingly (FIG. 22G), and then, the ignition determination signal $V_{fail}$ is outputted (FIG. 22H). FIG. 22G shows that the equivalent quantity of heat storage $H_{ac}$ reaches the device protection sensing level at the fifth cycle. However, the number of cycles at which the equivalent quantity of heat storage $H_{ac}$ reaches the device protection sensing level may vary depending on the peak value and the duty ratio of the reflected wave voltage $V_r$.

A device for determining ignition may be configured by a hard circuit. Alternatively, it may be configured by digital operation processing such as DSP and FPGA. If software is employed, it may be configured by a memory, and the like, storing programs that directs a CPU to perform processing of the CPU and an ignition determiner.

The preferred embodiments and modifications described above are examples of the operations relating to determination of plasma ignition and the apparatus thereof according to the present invention. The present invention is not limited to those exemplary embodiments and various modifications are possible, and all such modifications are intended to be included within the scope of the invention.

INDUSTRIAL APPLICABILITY

The high-frequency power supply device of the present invention can be used for a film forming apparatus for producing a thin film, such as a semiconductor, liquid crystal, and solar panel, and a plasma generation according to high-frequency (RF), such as $CO_2$ laser beam machine, where the high-frequency power supply device is applicable to supply power to plasma load.

DESCRIPTION OF SYMBOLS 1 high-frequency power supply device
2 high-frequency output section
3 power controller
3a average forward wave power controller
3b peak forward wave power controller
3c average processor
4 duty controller
5 directional coupler
6 forward wave power detector
7 reflected wave power detector
10 ignition determiner
11 conversion means
11A first conversion means
11B second conversion means
11C third conversion means
12 comparison means
20 pulse output section
20A pulse output section
20B pulse output section
20C pulse output section
21 pulse trigger forming means
21a prepulse trigger forming means
21b main pulse trigger forming means
22 ignition pulse former
22a prepulse forming means
22b main pulse forming means
22c drive pulse forming means
22d main pulse and drive pulse forming means
23a pulse gate means
23b pulse gate means
23c pulse gate means
24 output stop means (shut-off means)
25 pulse forming means
101 matching box 102 load
$D_{on}$ duty
$H_{ac}$ equivalent quantity of heat storage
n set number of pulses
N set number of operations
T one cycle
$V_f$ forward wave voltage
$V_{fail}$ ignition determination signal
$V_r$ reflected wave voltage
$\Gamma$ reflection coefficient

What is claimed is:

1. A plasma ignition method of a high-frequency power supply device, the method igniting plasma by applying high-frequency power from the high-frequency power supply device, comprising,
  a plasma ignition step that ignites the plasma by a pulse output delivered on an intermittent time base, and
  a plasma drive power supply step that supplies drive power to maintain the plasma being ignited, after the plasma is ignited by the plasma ignition step, wherein,
  the plasma ignition step includes an ignition pulse output operation that outputs an ignition pulse to ignite the plasma,
  the ignition pulse includes an optional number of prepulses and a main pulse, each of the prepulses having power lower than the power of the main pulse and delivered at a stage prior to the main pulse, and the main pulse being delivered initially after the prepulses, and
  after the plasma is ignited by the plasma ignition step, the plasma ignition step is shifted to the plasma drive power supply step that supplies drive power to maintain the plasma being ignited.

2. The plasma ignition method of the high-frequency power supply device, according to claim 1, wherein,
  during a period for performing the ignition pulse output operation, any output interval is set for the prepulses.

3. The plasma ignition method of the high-frequency power supply device, according to claim 1, wherein,
  power of the pulse output of the prepulses is set in such a manner that average reflected power generated by the pulse output is equal to or less than allowable loss of power elements that form a high-frequency power source.

4. A high-frequency power supply device configured to ignite plasma by applying high-frequency power, comprising,
  a pulse output section configured to deliver a pulse output of high-frequency output, wherein,
  the pulse output section comprises,
  an ignition pulse former configured to form an ignition pulse that ignites the plasma by the pulse output delivered on an intermittent time base, and
  a drive pulse former configured to form a drive pulse that supplies drive power to maintain the plasma being ignited, after the plasma is ignited by the ignition pulse, wherein,
  the ignition pulse includes an optional number of prepulses and a main pulse, each of the prepulses having power lower than the power of the main pulse and delivered at a stage prior to the main pulse, and the main pulse being delivered initially after the prepulses, and
  after the plasma is ignited by the ignition pulse, the drive pulse former supplies the drive power to maintain the plasma being ignited.

5. The high-frequency power supply device according to claim 4, wherein,
  the ignition pulse former sets any output interval for the prepulses in forming the ignition pulse.

6. The high-frequency power supply device according to claim 4, wherein,
  the ignition pulse former sets power of the pulse output of the prepulses in such a manner that average reflected power generated by the pulse output is equal to or less than allowable loss of power elements that form a high-frequency power source.

* * * * *